(12) United States Patent
Choi

(10) Patent No.: US 11,257,559 B1
(45) Date of Patent: Feb. 22, 2022

(54) TEST CIRCUIT, MEMORY DEVICE, STORAGE DEVICE, AND METHOD OF OPERATING THE SAME

(71) Applicant: SK hynix Inc., Gyeonggi-do (KR)

(72) Inventor: Sung Won Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/161,261

(22) Filed: Jan. 28, 2021

(30) Foreign Application Priority Data

Aug. 12, 2020 (KR) .......................... 10-2020-0101386

(51) Int. Cl.
| | |
|---|---|
| *G11C 29/02* | (2006.01) |
| *G11C 29/12* | (2006.01) |
| *G11C 29/04* | (2006.01) |
| *G11C 16/34* | (2006.01) |
| *G11C 29/00* | (2006.01) |

(52) U.S. Cl.
CPC ........ *G11C 29/025* (2013.01); *G11C 16/3495* (2013.01); *G11C 29/00* (2013.01); *G11C 29/04* (2013.01); *G11C 29/12005* (2013.01); *G11C 29/12015* (2013.01)

(58) Field of Classification Search
CPC .............. G11C 29/04; G11C 29/12005; G11C 29/12015; G11C 16/3495; G11C 29/00
USPC ....................................................... 365/201
See application file for complete search history.

(56) References Cited

U.S. PATENT DOCUMENTS

| | | | |
|---|---|---|---|
| 2015/0206601 A1* | 7/2015 | Jeong | ..................... G11C 29/50 365/201 |
| 2016/0078958 A1 | 3/2016 | Wang et al. | |
| 2016/0133339 A1* | 5/2016 | Lee | .................. G11C 29/56004 714/719 |

FOREIGN PATENT DOCUMENTS

KR   10-1100905   1/2012

\* cited by examiner

*Primary Examiner* — Anthan Tran
(74) *Attorney, Agent, or Firm* — IP & T Group LLP

(57) ABSTRACT

Provided herein may be a test circuit, a memory device, a storage device, and a method of operating the same. The word line test circuit may include an operation signal generator configured to generate a plurality of operation signals in response to a test command, a comparison result generator configured to, in response to the plurality of operation signals, generate a target voltage based on a test current, in which a current of a target word line varying with a test voltage is reflected, and to generate a comparison signal based on a result of a comparison between the target voltage and a reference voltage, and a word line defect detector configured to detect a defect in the target word line based on at least one reference count and a count of a reference clock, cycles of which are counted until a level of the comparison signal changes from a first level to a second level.

20 Claims, 16 Drawing Sheets

TEST CIRCUIT, MEMORY DEVICE, STORAGE DEVICE, AND METHOD OF OPERATING THE SAME

CROSS-REFERENCE TO RELATED APPLICATION

The present application claims priority under 35 U.S.C. § 119(a) to Korean patent application number 10-2020-0101386, filed on Aug. 12, 2020, which is incorporated herein by reference in its entirety.

BACKGROUND

Field of Invention

Various embodiments of the present disclosure generally relate to an electronic device, and more particularly, to a test circuit, a memory device, a storage device, and a method of operating the same.

Description of Related Art

A storage device stores data under the control of a host. The storage device may include a memory device which stores data and a memory controller which controls the memory device. Generally, there are two types of memory devices: volatile memory devices and nonvolatile memory devices.

A volatile memory device may store data only while power is supplied from a power source. When the supply of power is interrupted, data stored in the volatile memory device may be lost. Examples of volatile memory devices include a static random access memory (SRAM) and a dynamic random access memory (DRAM).

In a nonvolatile memory device stored data is retained even when the supply of power from a power source is interrupted. Examples of nonvolatile memory devices include a read only memory (ROM), a programmable ROM (PROM), an electrically programmable ROM (EPROM), an electrically erasable and programmable ROM (EEPROM), and a flash memory.

SUMMARY

Various embodiments of the present disclosure are directed to a storage device that detects defects in word lines, thus preventing deterioration of performance.

An embodiment of the present disclosure may provide for a word line test circuit. The word line test circuit may include an operation signal generator configured to generate a plurality of operation signals in response to a test command, a comparison result generator configured to, in response to the plurality of operation signals, generate a target voltage based on a test current, in which a current of a target word line varying with a test voltage is reflected, and to generate a comparison signal based on a result of a comparison between the target voltage and a reference voltage, and a word line defect detector configured to detect a defect in the target word line based on at least one reference count and a count of a reference clock, cycles of which are counted until a level of the comparison signal changes from a first level to a second level.

An embodiment of the present disclosure may provide for a memory device. The memory device may include a memory cell array including a plurality of memory cells, and a word line test circuit configured to generate a test voltage in response to a test command, charge a target voltage based on a test current, in which a current of a target word line varying with the test voltage is reflected, generate a comparison signal based on a result of a comparison between the target voltage and a reference voltage, and detect a defect in the target word line based on at least one reference count and a count of a reference clock, cycles of which are counted until a level of the comparison signal changes from a first level to a second level.

An embodiment of the present disclosure may provide for a storage device. The storage device may include a memory controller configured to output a test command instructing a check whether a defect is present in a target word line, and a memory device configured to generate a test voltage in response to the test command, charge a target voltage based on a test current, in which a current of the target word line varying with the test voltage is reflected, generate a comparison signal based on a result of a comparison between the target voltage and a reference voltage, detect a defect in the target word line based on at least one reference count and a count of a reference clock, cycles of which are counted until a level of the comparison signal changes from a first level to a second level, and provide a test response that is a response to the test command to the memory controller.

An embodiment of the present disclosure may provide for an operating method of a memory device. The operating method of the memory device may include applying a test voltage to a word line to generate a current in the word line, charging a capacitive charger to a steady voltage level based on the current, and determining whether the word line is defective based on an amount of time it takes to discharge the capacitive charger from the steady voltage level to a reference voltage level.

DETAILED DESCRIPTION

Specific structural and functional description is provided to describe embodiments of the present disclosure. The present invention, however, may be practiced in various forms and carried out in various ways, and thus should not be construed as being limited to any of the disclosed embodiments. Also, throughout the specification, reference to "an embodiment," "another embodiment" or the like is not necessarily to only one embodiment, and different references to any such phrase are not necessarily to the same embodiment(s). Moreover, the use of an indefinite article (i.e., "a" or "an") means one or more, unless it is clear that only one is intended. Similarly, terms "comprising," "including," "having" and the like, when used herein, do not preclude the existence or addition of one or more other elements in addition to the stated element(s).

Figure 1:
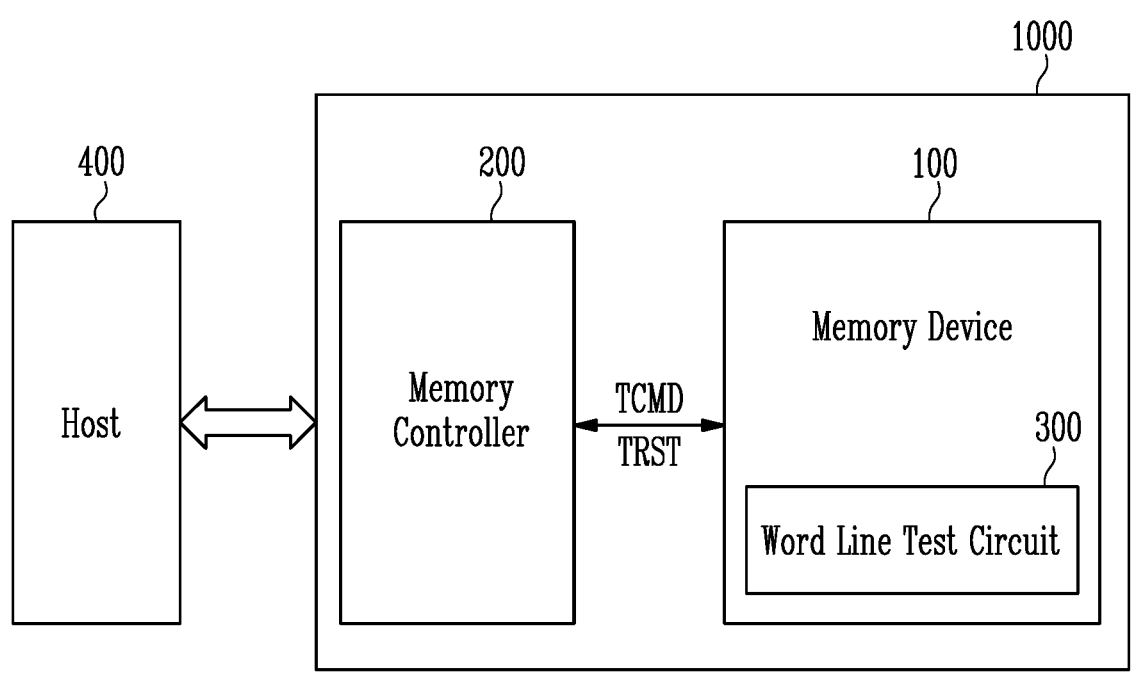
FIG. 1 is a diagram illustrating a storage system according to an embodiment of the present disclosure.

FIG. 1 is a diagram illustrating a storage system according to an embodiment of the present disclosure.

Referring to FIG. 1, the storage system may be implemented as a personal computer (PC), a data center, an enterprise data storage system, a data processing system including a direct attached storage (DAS), a data processing system including a storage area network (SAN), or a data processing system including a network attached storage (NAS).

The storage system may include a storage device 1000 and a host 400.

The storage device 1000 may be a device which stores data in response to a request received from the host 400, such as a mobile phone, a smartphone, an MP3 player, a laptop computer, a desktop computer, a game console, a TV, a tablet PC, or an in-vehicle infotainment system.

The storage device 1000 may be manufactured or configured as any of various types of storage devices depending on a host interface that is a scheme for communication with the host 400. For example, the storage device 1000 may be implemented as any of a solid state disk (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnect (PCI)-card type storage device, a PCI express (PCI-E) card-type storage device, a compact flash (CF) card, a smart media card, and/or a memory stick.

The storage device 1000 may be manufactured in any of various types of package forms. For example, the storage device 1000 may be manufactured as package on package (POP), system in package (SIP), system on chip (SOC), multi-chip package (MCP), chip on board (COB), wafer-level fabricated package (WFP), and/or wafer-level stack package (WSP).

The storage device 1000 may include a memory device 100 and a memory controller 200.

The memory device 100 may be operated in response to the control of the memory controller 200. In detail, the memory device 100 may receive a command and an address from the memory controller 200, and may access memory cell(s) selected from among memory cells (not illustrated) by the address. The memory device 100 may perform an operation indicated by the command on the memory cell(s) selected by the address.

The command may be, for example, a program command, a read command or an erase command, and the operation indicated by the command may be, for example, a program operation (or a write operation), a read operation or an erase operation.

For example, the memory device 100 may receive a program command, an address, and data, and may program the data to the memory cell(s) selected by the address. Here, the data to be programmed to the selected memory cell(s) may be defined as write data.

For example, the memory device 100 may receive a read command and an address, and may read data from the area of a memory cell array (not illustrated), selected by the address. Among pieces of data stored in the memory device 100, data to be read from the selected area may be defined as read data.

For example, the memory device 100 may receive an erase command and an address, and may erase data stored in the area selected by the address.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM).

In the present specification, by way of example, features and aspects of the invention are described in the context in which the memory device 100 is a NAND flash memory.

The memory device 100 may store the write data, or may read the stored read data and provide the read data to the memory controller 200, under the control of the memory controller 200.

The memory device 100 may include at least one plane. A single plane may include a memory cell array including memory cells which store write data.

The memory cell array may include a plurality of memory blocks (not illustrated). A memory block may be a unit on which an operation of erasing data is performed.

Each of the memory blocks may include a plurality of word lines. For example, a first memory block may include a plurality of word lines, and a second memory block may include a plurality of word lines.

Each memory block may include a plurality of pages (not illustrated). A page may be a unit on which a program operation of storing write data or a read operation of reading stored read data is performed.

The memory device 100 may perform a test operation of detecting defects in one or more word lines in response to a test command TCMD provided from the memory controller 200. For this, the memory device 100 may include a word line test circuit 300.

After performing the test operation, the memory device 100 may provide a test result TRST as a response to the test command TCMD to the memory controller 200.

The test result TRST may include data indicating that the test operation has been completed, data about respective states of the plurality of word lines, or data about word line(s) detected to be defective. Here, the state of each of the plurality of word lines may mean, for example, a normal state or a defective state.

In an embodiment, when it is detected that a target word line is defective, the memory device 100 may store data about the defective target word line, and may provide the data to the memory controller 200 under the control of the memory controller 200.

The memory controller 200 may control overall operation of the storage device 1000.

When power is applied to the storage device 1000, the memory controller 200 may run firmware (FW). When the memory device 100 is a flash memory device, the firmware may include a host interface layer, a flash translation layer, and a flash interface layer.

The host interface layer may control an operation between the host 400 and the memory controller 200.

The flash translation layer may translate a logical address provided from the host 400 into a physical address. For this operation, the memory controller 200 may store map data indicating corresponding relationships between logical addresses and physical addresses.

The flash interface layer may control communication between the memory controller 200 and the memory device 100.

The memory controller 200 may control the memory device 100 so that a program operation, a read operation, and an erase operation are respectively performed in response to a write request, a read request, and an erase request received from the host 400.

During a program operation, the memory controller 200 may provide a program command, a physical address, and write data to the memory device 100.

During a read operation, the memory controller 200 may provide a read command and a physical address to the memory device 100.

During an erase operation, the memory controller 200 may provide an erase command and a physical address to the memory device 100.

The memory controller 200 may autonomously generate a command, an address, and data in the absence of a request provided from the host 400. The memory controller 200 may transmit the autonomously generated command, address, and data to the memory device 100.

For example, the memory controller 200 may generate a command, an address, and data to perform a background operation. Further, the memory controller 200 may transmit the command, address, and data to the memory device 100.

The background operation may be at least one of a wear leveling operation, a read reclaim operation, and a garbage collection operation.

The wear leveling operation may include storing a count of the number of times erase operations have been performed on memory blocks and programming data to a memory block on which the erase count is the smallest.

The read reclaim operation may include moving data stored in a memory block to another memory block before an uncorrectable error occurs in the data stored in the memory block.

The garbage collection operation may include copying valid data included in a bad block, among memory blocks, to a free block and erasing invalid data in the bad block.

The memory controller 200 may control two or more memory devices 100. In this case, the memory controller 200 may control the memory devices 100 according to an interleaving scheme to improve operation performance.

The interleaving scheme may involve controlling the memory devices 100 so that the operations of two or more memory devices 100 overlap each other.

The memory controller 200 may provide the memory device 100 with a command that instructs that data indicating respective states of the plurality of word lines or data about a defective word line be provided.

The memory controller 200 may provide the memory device 100 with a command (not illustrated) that instructs that a memory block, corresponding to the word line detected to be defective based on the test result TRST be processed as a bad block. In this case, in response to the command, the memory device 100 may process the memory block corresponding to the word line detected to be defective as a bad block.

In an embodiment, when the memory device 100 provides data about the defective target word line to the memory controller 200, the memory controller 200 may control the memory device 100 so that, based on the data, the memory block corresponding to the target word line, among the plurality of memory blocks in the memory device 100, is processed as a bad block.

The word line test circuit 300 included in the memory device 100 may receive the test command TCMD. The word line test circuit 300 may generate a test voltage in response to the test command TCMD.

The test voltage may be applied to the target word line selected from among the plurality of word lines (not illustrated). Generally, the word lines may be made of a metal material such as copper. Therefore, when the test voltage is applied to the target word line, current is generated and flows through the target word line. The current of the target word line may change according to the test voltage.

The word line test circuit 300 may generate a test current in which the current of the target word line is reflected, and may charge a target voltage based on the test current.

The test current may be used to detect a defect in the target word line. The target voltage may correspond to the magnitude of the test current. The target voltage may become saturated at a specific level when a set time elapses since the generation of the test current. For example, when a specific amount of charge, which depends on the test current, is stored in a capacitor, the target voltage may be generated in response to that specific amount of charge stored in the capacitor.

The word line test circuit 300 may measure the target voltage. Different methods may be used for measuring an analog target voltage. The measured analog target voltage may be converted into a digital value. In another example, when the analog value of the target voltage cannot be directly sensed, the time taken for the target voltage to decrease from its current level to a specific level is measured, and thus the target voltage may be indirectly measured.

In an embodiment, when the time taken for the target voltage to decrease to the specific level is measured, the word line test circuit 300 may discharge the charged target voltage. Further, the word line test circuit 300 may count cycles of a reference clock (not illustrated) from the time at which the charged target voltage is discharged to the time at which the predetermined period elapses.

The word line test circuit 300 may detect a defect in the target word line based on a count of the reference clock and at least one set reference count. The word line test circuit 300 may output data about the detection result.

Although not illustrated in the drawing, the storage device 1000 may further include a buffer memory. In an embodiment, the buffer memory may be implemented as any of a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a resistive RAM (RRAM), a phase-change memory (PRAM), a magnetoresistive RAM (MRAM), a ferroelectric RAM (FRAM), or a spin transfer torque RAM (STT-RAM).

The host 400 may communicate with the storage device 1000 through an interface (not illustrated).

The interface may be implemented as a serial advanced technology attachment (SATA) interface, a SATA express (SATAe) interface, a serial attached small computer system interface (SAS), a peripheral component interconnect express (PCIe) interface, a non-volatile memory Express (NVMe) interface, an advanced host controller interface (AHCI) interface, or a multimedia card interface. However, the present invention is not limited to any particular interface.

The host 400 may communicate with the storage device 1000 so as to store write data in the storage device 1000 or acquire read data stored in the storage device 1000.

In an embodiment, the host 400 may provide the storage device 1000 with a write request that requests the storage device 1000 to store the write data. Further, the host 400 may provide the write request, the write data, and a logical address for identifying the write data to the storage device 1000.

The storage device 1000 may store the write data provided from the host 400 in the memory device 100 in response to the write request provided from the host 400, and may provide a response indicating that storage has been completed to the host 400.

In an embodiment, the host 400 may provide the storage device 1000 with a read request that requests the storage device 1000 to provide the data stored in the storage device 1000 to the host 400. Also, the host 400 may provide the read request and a read address to the storage device 1000.

The storage device 1000 may read, from the memory device 100, read data corresponding to the read address provided from the host 400 in response to the read request provided from the host 400, and may provide the read data as a response to the read request to the host 400.

Figure 2:
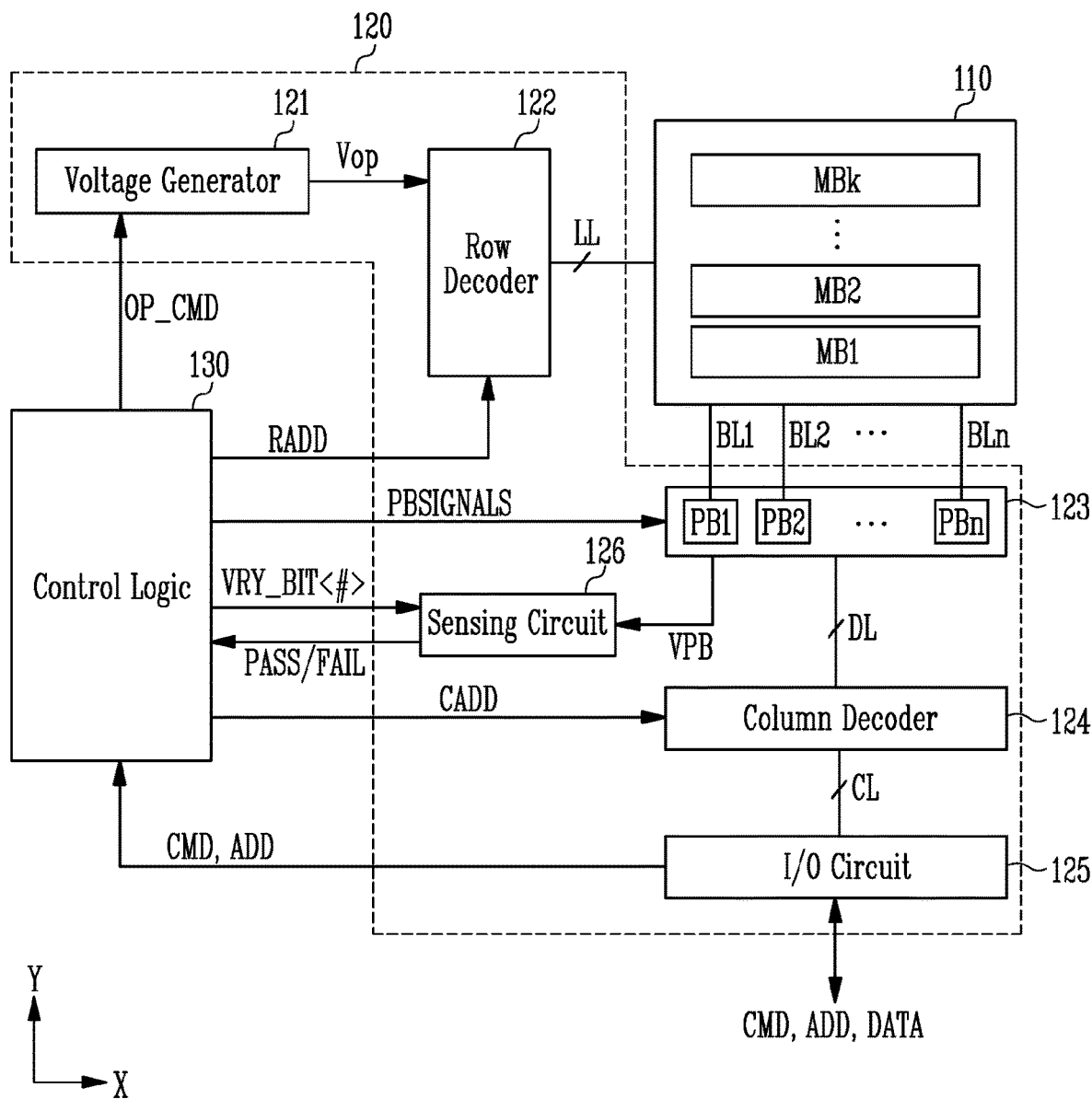
FIG. 2 is a diagram illustrating a memory device according to an embodiment of the present disclosure.

FIG. 2 is a diagram illustrating a memory device according to an embodiment of the present disclosure.

Referring to FIGS. 1 and 2, the memory device 100 may include a memory cell array 110, a peripheral circuit 120, and control logic 130.

The memory cell array 110 may include a plurality of memory blocks MB1 to MBk (where k is a positive integer of 2 or more).

Each of the memory blocks MB1 to MBk may be coupled to local lines LL and bit lines BL1 to BLn (where n is a positive integer of 2 or more).

The local lines LL may be coupled to a row decoder 122.

The local lines LL may be coupled to each of the memory blocks MB1 to MBk.

Although not illustrated in the drawing, the local lines LL may include a first select line, a second select line, and a plurality of word lines arranged between the first and second select lines.

Although not illustrated in the drawing, the local lines LL may further include dummy lines arranged between the first select line and the word lines, dummy lines arranged between the second select line and the word lines, and pipelines.

The bit lines BL1 to BLn may be coupled in common to the memory blocks MB1 to MBk.

The memory blocks MB1 to MBk may be implemented as a two-dimensional (2D) or three-dimensional (3D) structure.

For example, memory cells in the memory blocks MB1 to MBk having a 2D structure may be horizontally arranged on a substrate.

For example, memory cells in the memory blocks MB1 to MBk having a 3D structure may be vertically stacked on the substrate.

The peripheral circuit 120 may include a voltage generator 121, a row decoder 122, a page buffer group 123, a column decoder 124, an input/output (I/O) circuit 125, and a sensing circuit 126.

The voltage generator 121 may generate various operating voltages Vop for a program operation, a read operation, and an erase operation in response to an operation command OP_CMD. Further, the voltage generator 121 may selectively discharge the local lines LL in response to the operation command OP_CMD. For example, the voltage generator 121 may generate a program voltage, a verify voltage, pass voltages, a turn-on voltage, a read voltage, an erase voltage, a source line voltage, etc. under the control of the control logic 130.

In an embodiment, the voltage generator 121 may generate an internal supply voltage by regulating an external supply voltage. The internal supply voltage generated by the voltage generator 121 may be used as an operating voltage for the memory device 100.

In an embodiment, the voltage generator 121 may generate a plurality of voltages using the external supply voltage or the internal supply voltage. For example, the voltage generator 121 may include a plurality of pumping capacitors for receiving the internal supply voltage, and may generate a plurality of voltages by selectively enabling the plurality of pumping capacitors under the control of the control logic 130. The generated voltages may be supplied to the memory cell array 110 by the row decoder 122.

In an embodiment, the voltage generator 121 may generate a test voltage using the external supply voltage or the internal supply voltage. For example, the voltage generator 121 may generate the test voltage based on the internal supply voltage under the control of the control logic 130.

The test voltage generated by the voltage generator 121 may be supplied to the row decoder 122.

Although not illustrated in the drawing, the test voltage may be a voltage generated using power supplied from an external power source, for example, a battery, included in the storage device 1000.

The row decoder 122 may transfer the operating voltages Vop to the local lines LL in response to a row address RADD. The operating voltages Vop may be transferred to a selected memory block (any of MB1 to MBk) through the local lines LL.

For example, during a program operation, the row decoder 122 may apply a program voltage to a selected word line and apply a program pass voltage having a level lower than that of the program voltage to unselected word lines. During a program verify operation, the row decoder 122 may apply a verify voltage to a selected word line and apply a verify pass voltage higher than the verify voltage to unselected word lines.

During a read operation, the row decoder 122 may apply a read voltage to a selected word line and apply a read pass voltage higher than the read voltage to unselected word lines.

During an erase operation, the row decoder 122 may select one memory block according to a decoded address. During the erase operation, the row decoder 122 may apply a ground voltage to word lines coupled to the selected memory block.

The row decoder 122 may transfer the test voltage to the local lines LL in response to a row address RADD. The test voltage may be transferred to the memory blocks MB1 to MBk through the local lines LL. The test voltage may be transferred to a target word line, among a plurality of word lines included in each memory block.

The page buffer group 123 may include first to n-th page buffers PB1 to PBn, which may be coupled to the memory cell array 110 through the first to n-th bit lines BL1 to BLn. The first to n-th page buffers PB1 to PBn may be operated under the control of the control logic 130.

In detail, the first to n-th page buffers PB1 to PBn may be operated in response to page buffer control signals PBSIGNALS. For example, the first to n-th page buffers PB1 to PBn may temporarily store data received through the first to n-th bit lines BL1 to BLn, or may sense voltages or currents of the bit lines BL1 to BLn during a read or verify operation.

During a program operation, when the program voltage is applied to the selected word line, the first to n-th page buffers PB1 to PBn may transfer data DATA, received through the column decoder 124 and the input/output circuit 125, to selected memory cells through the first to n-th bit lines BL1 to BLn. The memory cells in a selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibition voltage (for example, a supply voltage) is applied may be maintained.

During a verify operation, the first to n-th page buffers PB1 to PBn may sense data stored in the selected memory cells from the selected memory cells through the first to n-th bit lines BL1 to BLn.

During a read operation, the first to n-th page buffers PB1 to PBn may sense data DATA from the memory cells in the selected page through the first to n-th bit lines BL1 to BLn, and may output the sensed data DATA to the input/output circuit 125 under the control of the column decoder 124.

During an erase operation, the first to n-th page buffers PB1 to PBn may allow the first to n-th bit lines BL1 to BLn to float.

The column decoder 124 may transfer data between the input/output circuit 125 and the page buffer group 123 in response to a column address CADD. For example, the column decoder 124 may exchange data with the page buffers PB1 to PBn through data lines DL, or may exchange data with the input/output circuit 125 through column lines CL.

The input/output circuit 125 may transfer a command CMD and an address ADD, received from the memory controller 200, to the control logic 130, or may exchange the data DATA with the column decoder 124.

Referring to FIGS. 1 and 2, in an embodiment, the input/output circuit 125 may transfer a test command TCMD output from the memory controller 200 to the control logic 130.

During a read or verify operation, the sensing circuit 126 may generate a reference current in response to an enable bit VRY_BIT<#>, and may compare a sensing voltage VPB received from the page buffer group 123 with a reference voltage generated by the reference current and then output a pass signal PASS or a fail signal FAIL.

The control logic 130 may control the peripheral circuit 120 by outputting the operation command OP_CMD, the row address RADD, the page buffer control signals PBSIGNALS, and the enable bit VRY_BIT<#> in response to the command CMD and the address ADD.

Referring to FIGS. 1 and 2, the control logic 130 may provide the row address RADD corresponding to the target word line, among the plurality of word lines, to the row decoder 122 in response to the test command TCMD, and may provide the operation command OP_CMD, instructing the generation of a test voltage, to the voltage generator 121.

Figure 3:
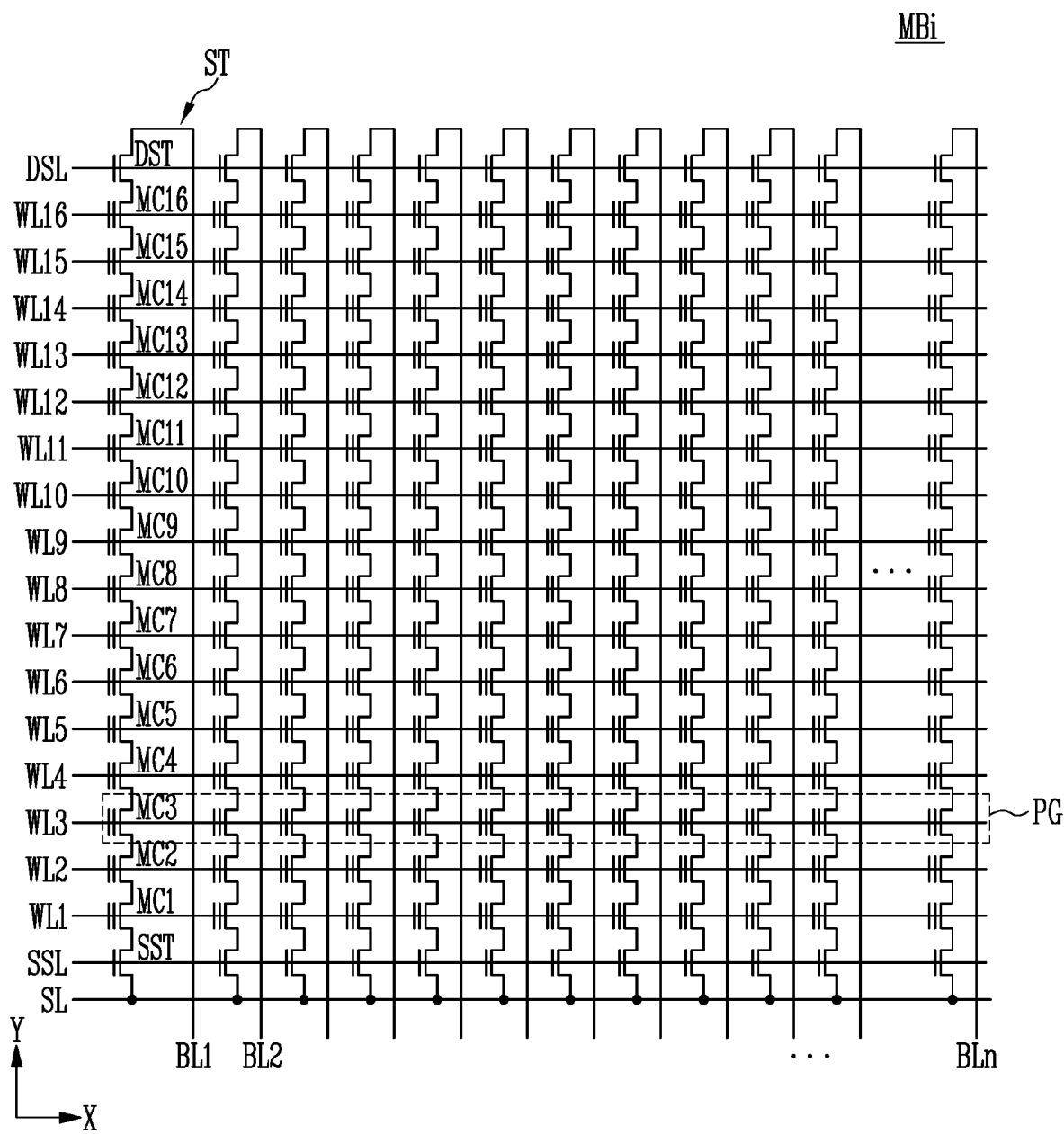
FIG. 3 is a diagram illustrating an exemplary structure of any one of a plurality of memory blocks of FIG. 2.

FIG. 3 is a diagram illustrating an exemplary structure of a representative memory block (MBi) of a plurality of memory blocks of FIG. 2.

Referring to FIG. 3, the memory block MBi illustrated in FIG. 3 may be any one of the memory blocks MB1 to MBk of FIG. 2.

The memory block MBi may include a first select line, a second select line, a plurality of word lines WL1 to WL16, a source line SL, a plurality of bit lines BL1 to BLn, and a plurality of strings ST.

The first select line may be, for example, a source select line SSL, as is assumed in the description below.

The second select line may be, for example, a drain select line DSL, as is assumed in the description below.

The plurality of word lines WL1 to WL16 may be arranged in parallel between the source select line SSL and the drain select line DSL.

The number of word lines WL1 to WL16 illustrated in FIG. 3 is exemplary; the invention is not limited to any specific number of word lines.

Generally, the plurality of word lines WL1 to WL16 may be made of a metal material. The word lines WL1 to WL16 may have respective resistance values. Parasitic capacitors may be present between the plurality of word lines WL1 to WL16. Therefore, when each operating voltage Vop or a test voltage is applied to the plurality of word lines WL1 to WL16, current at a specific level flows through each of the word lines WL1 to WL16, and the current is gradually decreased over time. In this case, according to an RC time constant given by the resistance of the corresponding word line and the capacitance of a parasitic capacitor between word lines, the current may be exponentially decreased from the specific level.

Here, the resistance of the corresponding word line and the capacitance of the parasitic capacitor differ depending on the size of the word line (e.g., width, thickness, height, etc.), and thus the RC time constant determined thereby may differ depending on the size of the word line. When the RC time constant varies for each word line, the levels of currents flowing through the plurality of word lines WL1 to WL16 may vary. Also, when the RC time constant varies for each word line, the time taken for the current to be decreased below a set level may vary. In this case, when an operating voltage at the same level (e.g., a program voltage) is applied to the word line, the time it takes to complete the operation (e.g., the time taken for a program operation to be completed) may vary for each of the word lines WL1 to WL16.

Therefore, there is a need to manufacture all of the plurality of word lines WL1 to WL16 to have a uniform size, but, at the actual manufacture step, one or more of word lines, among the plurality of word lines WL1 to WL16, may have a different size than a target size. Each word line having a size different from the target size may be defined as a defective word line. Defective word line(s) in the storage device 1000 may cause its performance to deteriorate. Thus, there is a need to detect defective word line(s) to prevent or reduce such deterioration.

The source line SL may be coupled in common to the plurality of strings ST.

The plurality of bit lines BL1 to BLn may be coupled to the strings ST, respectively.

The plurality of strings ST may be coupled to the bit lines BL1 to BLn and the source line SL.

Since each of the strings ST may be configured the same, a string ST coupled to the first bit line BL1 is described in detail by way of example.

The string ST may include a plurality of memory cells MC1 to MC16, at least one first select transistor, and at least one second select transistor.

The memory cells MC1 to MC16 may be coupled in series to each other between a source select transistor SST and a drain select transistor DST.

Gates of the memory cells MC1 to MC16 may be respectively coupled to the word lines WL1 to WL16. Therefore, the number of memory cells MC1 to MC16 included in one string ST may be equal to the number of word lines WL1 to WL16.

Each of the plurality of memory cells MC1 to MC16 may be implemented as, for example, an SLC, an MLC, a TLC, or a QLC.

A group of memory cells coupled to the same word line, among the memory cells included in different strings ST, may be referred to as a 'physical page (PG)'. Therefore, the memory block MBi may include the same number of physical pages (PG) as word lines WL1 to WL16. Hereinafter, it is assumed that memory cells (e.g., MC3) included in a physical page (PG) are selected memory cells.

The first select transistor may be, for example, the source select transistor SST, as is assumed in the description below.

A first electrode of the source select transistor SST may be coupled to the source line SL. A second electrode of the source select transistor SST may be coupled to the first memory cell MC1, among the plurality of memory cells MC1 to MC16. A gate electrode of the source select transistor SST may be coupled to the source select line SSL.

The second select transistor may be, for example, the drain select transistor DST, as is assumed in the description below.

A first electrode of the drain select transistor DST may be coupled to the sixteenth memory cell MC16, among the plurality of memory cells MC1 to MC16. A second electrode of the drain select transistor DST may be coupled to the first bit line BL1. A gate electrode of the drain select transistor DST may be coupled to the drain select line DSL.

Figure 4:
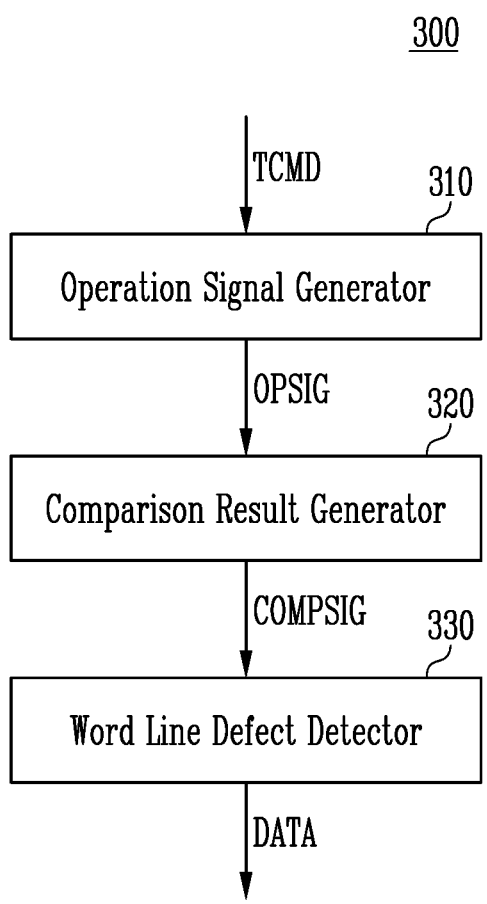
FIG. 4 is a diagram illustrating a word line test circuit according to an embodiment of the present disclosure.

FIG. 4 is a diagram illustrating a word line test circuit according to an embodiment of the present disclosure.

Referring to FIG. 4, the word line test circuit 300 may receive a test command TCMD. The word line test circuit 300 may generate a test voltage in response to the test command TCMD. The word line test circuit 300 may generate a target voltage by storing charge using the test voltage. The word line test circuit 300 may discharge the target voltage, and may generate a comparison signal COMPSIG based on the result of a comparison between the target voltage and a reference voltage. The word line test circuit 300 may detect a defect in a target word line based on a count of a reference clock, cycles of which are counted until the level of the comparison signal COMPSIG changes from a first level to a second level, and at least one set reference count.

The word line test circuit 300 may include an operation signal generator 310, a comparison result generator 320, and a word line defect detector 330.

The operation signal generator 310 may generate a plurality of operation signals OPSIG in response to the test command TCMD.

Each of the operation signals OPSIG may be a turn-on level signal.

In an embodiment, the operation signal generator 310 may generate first to third operation signals. Further, the operation signal generator 310 may sequentially output the first to third operation signals to the comparison result generator 320 based on the set timing.

In response to each of the plurality of operation signals OPSIG, the comparison result generator 320 may charge the target voltage based on a test current in which the current of the target word line, varying with the test voltage, is reflected, and may generate the comparison signal COMPSIG based on the result of the comparison between the target voltage and the reference voltage.

In an embodiment, the test current may be less than the current of the target word line.

The comparison signal COMPSIG may be generated at a first level when the target voltage is equal to or greater than the reference voltage. The comparison signal COMPSIG may be generated at a second level when the target voltage is less than the reference voltage.

The reference voltage may for determining a time at which the count of the reference clock is to be stopped or terminated. The reference voltage may be set by design, experiment, or the like before the corresponding product is shipped, but the invention is not limited thereto. The reference voltage may also be updated after the product has been shipped.

In accordance with an embodiment, the operation signal generator 310 may generate the first to third operation signals. In this case, the comparison result generator 320 may charge the target voltage in response to the first operation signal. The comparison result generator 320 may discharge the charged target voltage in response to the second operation signal. The comparison result generator 320 may generate the comparison signal COMPSIG based on the result of the comparison between the discharged target voltage and the reference voltage in response to the third operation signal.

The word line defect detector 330 may count cycles of the reference clock until the level of the comparison signal COMPSIG changes from the first level to the second level. Further, the word line defect detector 330 may detect a defect in the target word line based on the count of the reference clock and the at least one reference count, which may be set in advance.

In an embodiment, the word line defect detector 330 may count cycles of the reference clock until the level of the comparison signal COMPSIG changes from the first level to the second level, and may output a detection signal indicating a defect in the target word line depending on whether the count of the reference clock is less than the at least one reference count.

In an embodiment, a first reference count and a second reference count less than the first reference count may be preset. In this case, the word line defect detector 330 may count the reference clock until the level of the comparison signal COMPSIG changes from the first level to the second level, and may output a detection signal indicating that the target word line is normal depending on whether the count value of the reference clock falls within a range from the first reference count to the second reference count.

The word line defect detector 330 may output data DATA as the test result TRST under the control of the memory controller 200.

The data DATA may be information indicating respective states of the plurality of word lines. Alternatively, the data DATA may be information about a defective word line.

The word line test circuit 300 according to an embodiment of the present disclosure may be implemented using circuits included in each of the voltage generator 121, the row decoder 122, and the control logic 130 illustrated in FIG. 2.

According to the above description, the word line test circuit according to an embodiment of the present disclosure may prevent the performance of the storage device from deteriorating by detecting whether each of the word lines is defective.

Figure 5:
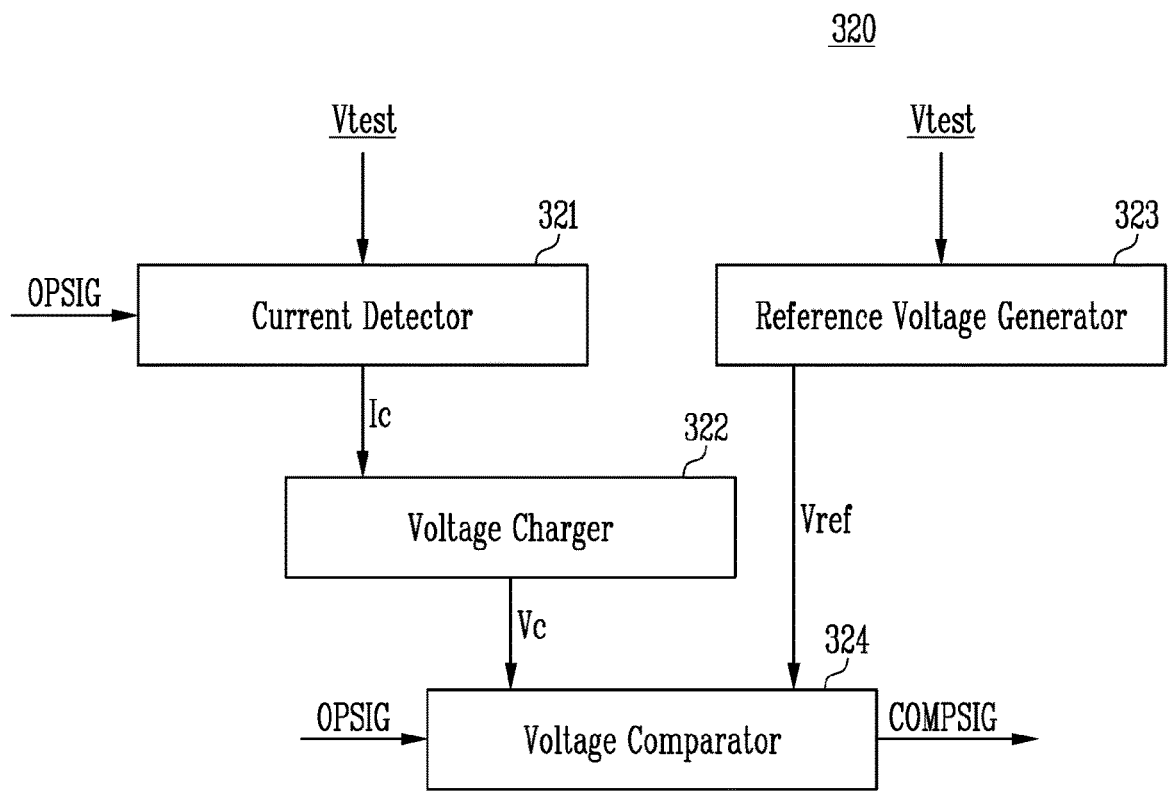
FIG. 5 is a diagram illustrating a comparison result generator, such as that of FIG. 4.

FIG. 5 is a diagram illustrating the comparison result generator of FIG. 4.

Referring to FIG. 5, the comparison result generator 320 may include a current detector 321, a voltage charger 322, a reference voltage generator 323, and a voltage comparator 324.

The current detector 321 may detect a test current Ic in response to operation signals OPSIG generated by the operation signal generator 310. In detail, the current detector 321 may detect the test current Ic, which is less than the current of the target word line, using a test voltage Vtest in response to a first operation signal. The current detector 321 may transfer the detected test current Ic to the voltage charger 322.

The voltage charger 322 may charge the target voltage Vc to a voltage obtained by integrating the test current Ic with respect to time. That is, the magnitude of the target voltage Vc charged in the voltage charger 322 may be the result of integrating the magnitude of the test current Ic with respect to time. The voltage charger 322 may transfer the charged target voltage Vc to the voltage comparator 324.

The reference voltage generator 323 may generate a reference voltage Vref based on the test voltage Vtest. The reference voltage generator 323 may transfer the reference voltage Vref to the voltage comparator 324.

The voltage comparator 324 may output a comparison signal COMPSIG at a first level or a second level based on the result of the comparison between the target voltage Vc and the reference voltage Vref in response to the operation signals OPSIG generated by the operation signal generator 310. In detail, the voltage comparator 324 may discharge the target voltage Vc charged in the voltage charger 322 in response to the second operation signal, and may output the comparison signal COMPSIG at the first level or the second level based on the result of the comparison between the discharged target voltage Vc and the reference voltage Vref in response the third operation signal.

The comparison signal COMPSIG may be generated at the first level when the target voltage Vc is equal to or greater than the reference voltage Vref. For example, the first level of the comparison signal COMPSIG may be logic high.

The comparison signal COMPSIG may be generated at the second level when the target voltage Vc is less than the reference voltage Vref. For example, the second level of the comparison signal COMPSIG may be logic low.

Figure 6:
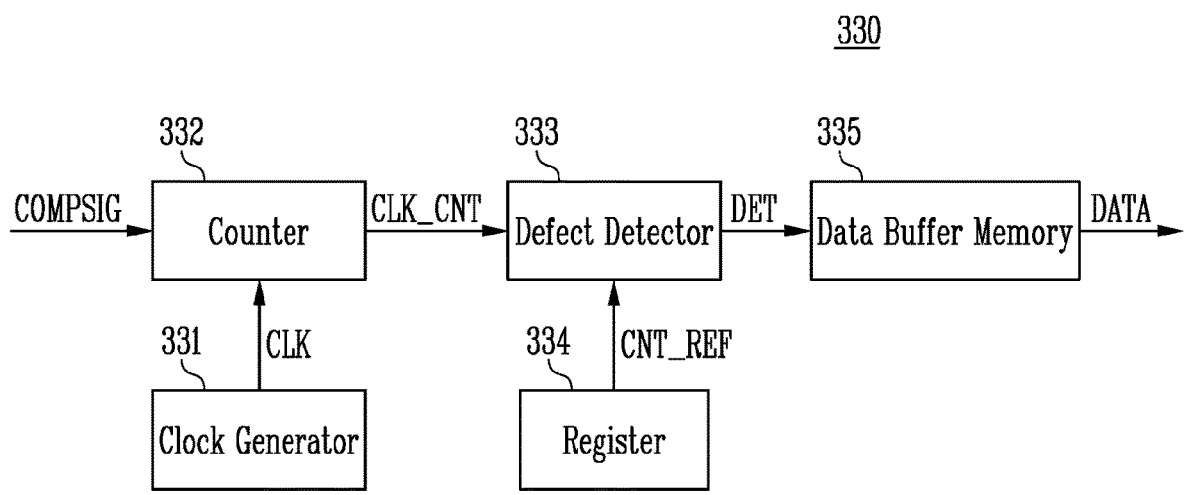
FIG. 6 is a diagram illustrating a word line defect detector, such as that of FIG. 4.

FIG. 6 is a diagram illustrating the word line defect detector of FIG. 4.

Referring to FIG. 6, the word line defect detector 330 may include a clock generator 331, a counter 332, a defect detector 333, a register 334, and a data buffer memory 335.

The clock generator 331 may generate a reference clock CLK. In detail, the clock generator 331 may generate the reference clock CLK in response to a test command TCMD. Alternatively, the clock generator 331 may generate the reference clock CLK when the storage device 1000 is powered on or is booted.

The reference clock CLK may have a uniform pulse width and a uniform period between respective pulses.

The counter 332 may start to count pulses of the reference clock CLK in response to a comparison signal COMPSIG at a first level. The counter 332 may count pulses of the reference clock CLK until the level of the comparison signal COMPSIG changes from the first level to a second level. The counter 332 may stop counting the reference clock CLK in response to the comparison signal COMPSIG at the second level.

In an example, rising edges of the reference clock CLK may be counted. Alternatively, pulses of the reference clock CLK may be counted. In general, cycles of the reference clock CLK may be counted in any suitable way to generate the count CLK_CNT.

The counter 332 may provide a signal indicative of the CLK_CNT to the defect detector 333.

The defect detector 333 may receive the CLK_CNT signal. Further, the defect detector 333 may receive a signal indicating at least one reference count CLK_REF.

The defect detector 333 may output a detection signal DET to the data buffer memory 335 based on CLK_CNT and the at least one reference count CNT_REF.

The detection signal DET may be data DATA about the result of detection of a target word line.

In an embodiment, the defect detector 333 may output the detection signal DET indicating a defect in the target word line depending on whether the count CLK_CNT of the reference clock CLK is less than one reference count.

In an embodiment, the defect detector 333 may output the detection signal DET indicating that the target word line is normal depending on whether the CLK_CNT falls within a range from a first reference count to a second reference count.

The register 334 may provide a signal indicating the reference count CNT_REF to the defect detector 333.

The data buffer memory 335 may store data DATA about the result of detection of the target word line from the detection signal DET. The data buffer memory 335 may output the data DATA under the control of the memory controller 200.

Figure 7:
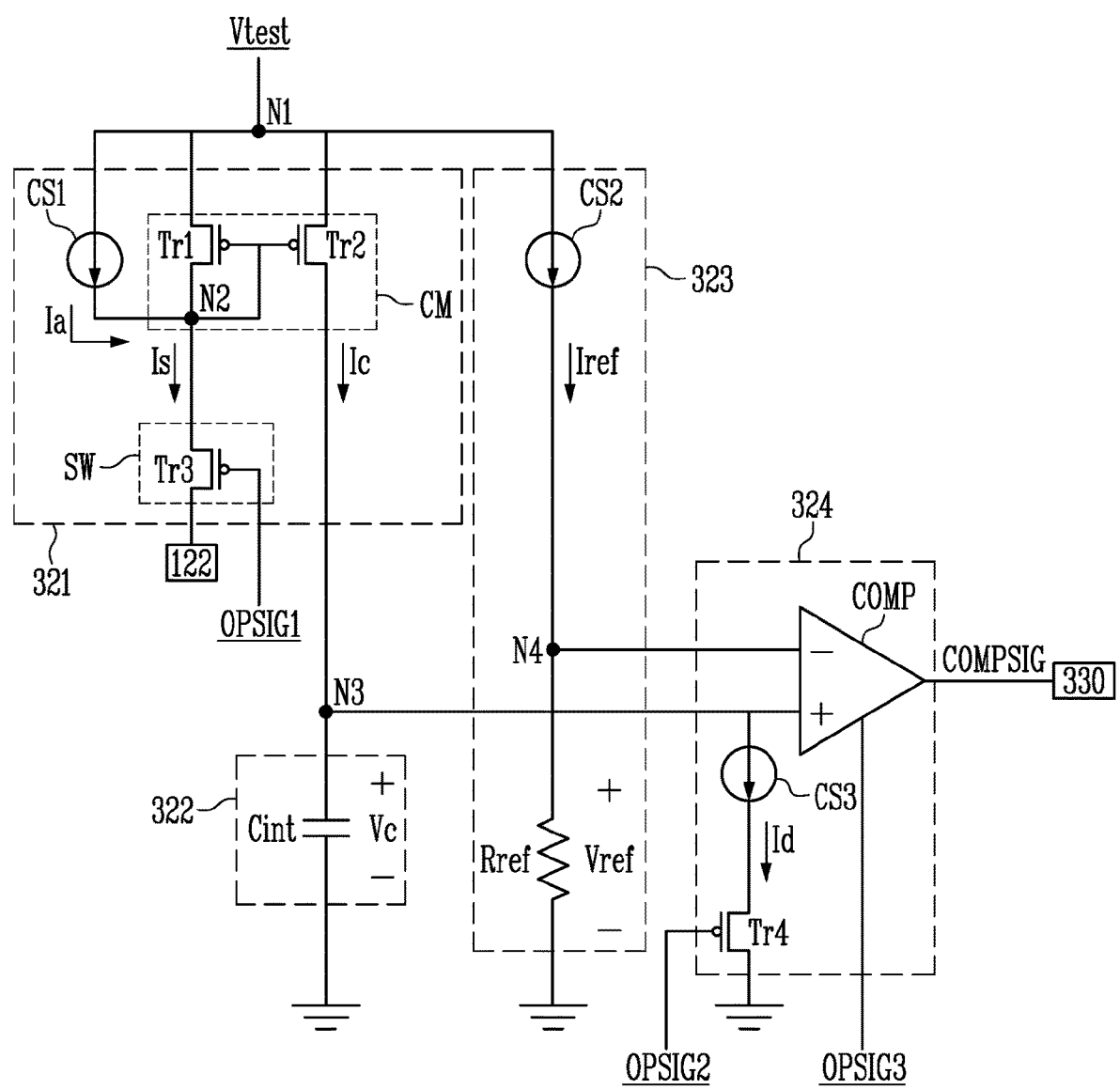
FIG. 7 is a circuit diagram illustrating an embodiment of a comparison result generator, such as that of FIG. 5.

FIG. 7 is a circuit diagram illustrating an embodiment of the comparison result generator of FIG. 5.

Referring to FIG. 7, in an embodiment, the current detector 321 included in the comparison result generator 320 may include a control current source CS1, a current mirror CM, and a switching component SW.

The control current source CS1 may provide a control current Ia. A first electrode of the control current source CS1 may be coupled to a first node N1, and a second electrode of the control current source CS1 may be coupled to a second node N2. The control current Ia may flow from the first node N1 to the second node N2.

The current mirror CM may output the current Is of a target word line, and may output a current, obtained by decreasing the current Is of the target word line by the magnitude of the control current Ia, as a test current Ic.

In an embodiment, the current mirror CM may include a first transistor Tr1 and a second transistor Tr2, gate electrodes of which are coupled in common to each other.

A first electrode of the first transistor Tr1 is coupled to the first node N1 to which a test voltage Vtest is applied, a second electrode of the first transistor Tr1 is coupled to the second node N2, and a gate electrode of the first transistor Tr1 is coupled to the second node N2.

A first electrode of the second transistor Tr2 is coupled to the first node N1, a second electrode of the second transistor Tr2 is coupled to a third node N3, and a gate electrode of the second transistor Tr2 is coupled to the second node N2.

The first transistor Tr1 and the second transistor Tr2 according to an embodiment may be, but are not limited to, P-type transistors, as illustrated in FIG. 7, and the current mirror CM may be implemented using N-type transistors.

The current Is of the target word line may flow from the second node N2 to the switching component SW.

The test current Ic may flow from the first node N1 to the third node N3.

The current mirror CM illustrated in FIG. 7 is only an example, and the invention is not limited to that illustrated in FIG. 7.

The switching component SW may electrically couple the current mirror CM to the target word line in response to a first operation signal OPSIG1.

Here, the target word line may be selected from among a plurality of word lines. The plurality of word lines may be coupled to local lines LL. The local lines LL may be coupled to the row decoder 122, for example, a global word line (not illustrated) or a local word line (not illustrated) included in the row decoder 122. Therefore, when the current mirror CM is electrically coupled to the target word line, the current mirror CM is electrically coupled to the row decoder 122.

In an embodiment, the switching component SW may include a third transistor Tr3 that is turned on in response to the first operation signal OPSIG1. However, the present invention is not limited thereto. While the description below is in the context in which the switching component SW includes a transistor, SW may be implemented in a suitable way consistent with the teachings herein.

A first electrode of the third transistor Tr3 may be coupled to the second node N2, a second electrode of the third transistor Tr3 may be coupled to the row decoder 122, and the first operation signal OPSIG1 may be provided to a gate electrode of the third transistor Tr3. In an embodiment, the second electrode of the third transistor Tr3 may be coupled to a global word line or a local word line included in the row decoder 122.

The current detector 321 illustrated in FIG. 7 is only an example of a configuration which detects the test current Ic, and the present is not limited to the circuit illustrated in FIG. 7. More generally, any type of circuit consistent with the teachings herein may be used to implement the current detector 321.

In an embodiment, the voltage charger 322 included in the comparison result generator 320 may include a capacitor Cint.

The capacitor Cint may be charged to the target voltage Vc using the test current Ic output from the current detector 321. A first electrode of the capacitor Cint may be coupled to the third node N3, and a second electrode of the capacitor Cint may be coupled to an electrode having a potential lower than that of the test voltage Vtest, for example, ground. The following description is based on the assumption that an electrode having a potential lower than that of the test voltage Vtest is the ground. However, the present invention is not limited to that configuration.

In an embodiment, the target voltage Vc charged in the capacitor Cint may be a voltage obtained by integrating the test current Ic with respect to time.

The target voltage Vc may be applied to the third node N3.

The voltage charger 322 illustrated in FIG. 7 is only an example of a configuration which generates the target voltage Vc by integrating the test current Ic, and the invention is not limited to the circuit illustrated in FIG. 7. Any suitable circuit may be used to implement the voltage charger 322 to perform its described functions, such as a circuit in which an amplifier (not illustrated) is additionally included in the voltage charger 322.

In an embodiment, the reference voltage generator 323 included in the comparison result generator 320 may include a reference current source CS2 and a reference resistor Rref.

The reference current source CS2 may provide a reference current Iref. A first electrode of the reference current source CS2 may be coupled to the first node N1, and a second electrode of the reference current source CS2 may be coupled to a fourth node N4. The reference current Iref may flow from the first node N1 to the reference resistor Rref.

The reference resistor Rref may have a reference resistance value. The reference resistor Rref may be coupled in series to the reference current source CS2. A first electrode of the reference resistor Rref may be coupled to the reference current source CS2, and a second electrode of the reference resistor Rref may be coupled to the ground.

Since the reference current Iref flows through the reference resistor Rref, the reference voltage Vref may be generated at the reference resistor Rref. The reference voltage Vref may be applied to the fourth node N4.

The reference voltage generator 323 illustrated in FIG. 7 is only an example of a configuration in which the reference voltage Vref is generated, and the invention is not limited to the circuit illustrated in FIG. 7. Any suitable circuit capable of generating Vref may be used to implement the reference voltage generator 323, such as a reference voltage source.

The voltage comparator 324 included in the comparison result generator 320 may include a flush current source CS3, a discharge control switching component Tr4, and a comparator COMP.

The flush current source CS3 may output a flush current Id. The flush current source CS3 may be coupled in parallel to the capacitor Cint. A first electrode of the flush current source CS3 may be coupled to the third node N3, and a second electrode of the flush current source CS3 may be coupled to the discharge control switching component Tr4.

The flush current Id may be for discharging the target voltage Vc charged in the voltage charger 322. The flush current Id may flow from the third node N3 to the ground through the switching component Tr4.

The discharge control switching component Tr4 may electrically couple the flush current source CS3 to the ground in response to the second operation signal OPSIG2. The discharge control switching component Tr4 may be coupled in series to the flush current source CS3.

In an embodiment, the discharge control switching component Tr4 may be a fourth transistor. However, the present invention is not limited that configuration. The description below is based on the assumption that the discharge control switching component Tr4 is a P-type transistor.

A first electrode of the discharge control switching component Tr4 may be coupled to the flush current source CS3, a second electrode of the discharge control switching component Tr4 may be coupled to the ground, and the second operation signal OPSIG2 may be provided to a gate electrode of the discharge control switching component Tr4.

The discharge control switching component Tr4 may be turned on in response to the second operation signal OPSIG2.

A comparator COMP may be turned on in response to a third operation signal OPSIG3. The comparator COMP may receive the target voltage and the reference voltage, and may output a comparison signal COMPSIG at a first level or a second level based on the result of a comparison between the target voltage and the reference voltage. A first input terminal of the comparator COMP may be coupled to the third node N3, a second input terminal of the comparator COMP may be coupled to the fourth node N4, a third operation signal OPSIG3 may be provided to a power input terminal of the comparator COMP, and an output terminal of the comparator COMP may be electrically coupled to the word line defect detector 330.

In an embodiment, the first input terminal may be a non-inverting terminal, and the second input terminal may be an inverting terminal.

In an embodiment, the first input terminal of the comparator COMP may be a positive electrode, and the second input terminal of the comparator COMP may be a negative electrode.

In an embodiment, the comparator COMP may output a comparison signal COMPSIG at a first level when the discharged target voltage is equal to or greater than the reference voltage, and may output a comparison signal COMPSIG at a second level when the discharged target voltage is less than the reference voltage.

In an embodiment, the comparator COMP may output a comparison signal COMPSIG at a first level when the third operation signal OPSIG3 is received. Further, the comparator COMP may output the comparison signal COMPSIG at a second level after the comparison signal COMPSIG at the first level has been output.

In an embodiment, after the first operation signal OPSIG1 has been output, the second operation signal OPSIG2 and the third operation signal OPSIG3 may be output.

The voltage comparator 324 illustrated in FIG. 7 is only an example of a configuration which compares the target voltage Vc with the reference voltage Vref and outputs the result of the comparison, and the invention is not limited to the circuit illustrated in FIG. 7. Any suitable circuit may be used to implement the voltage comparator 324.

Figure 8:
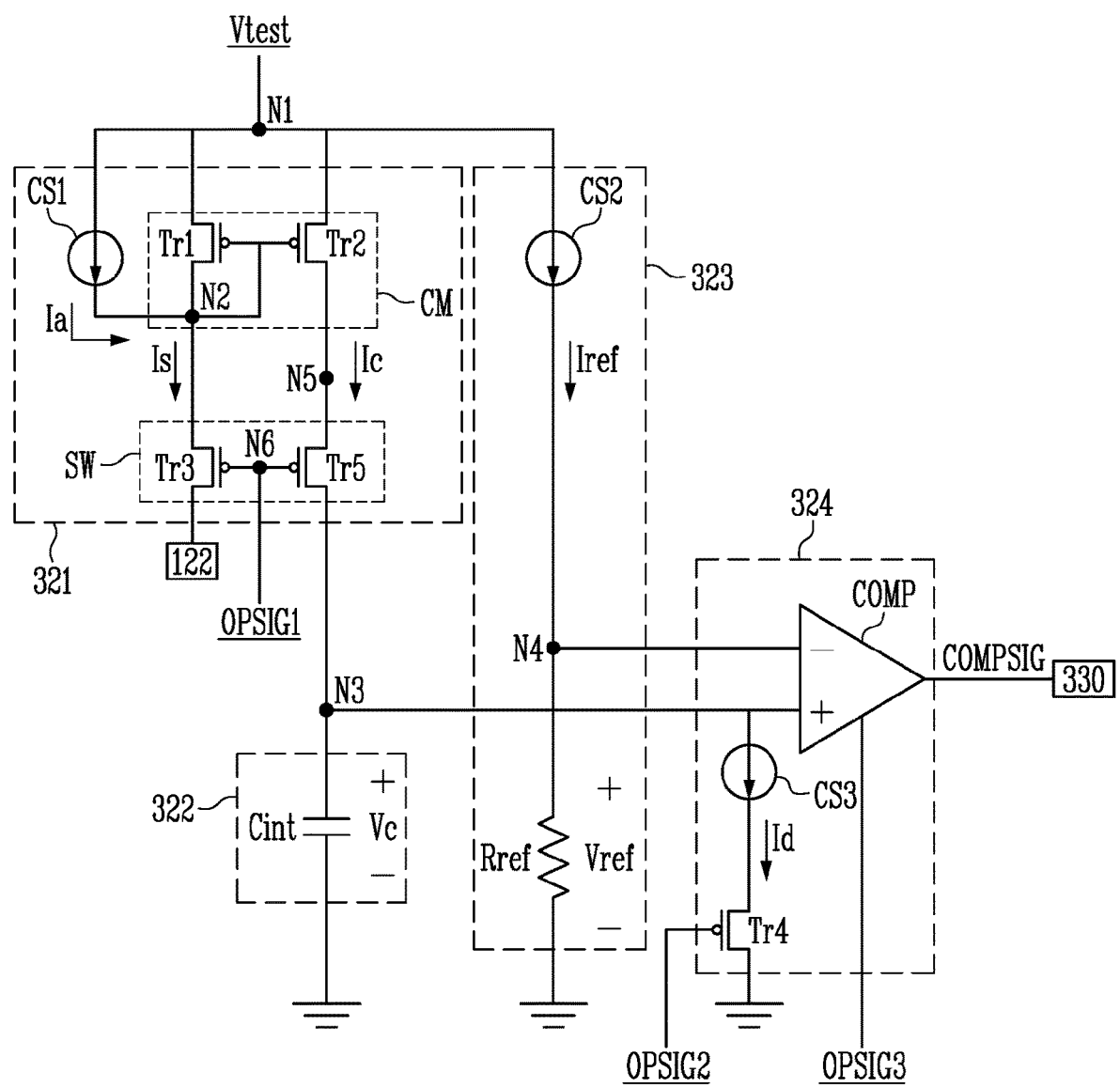
FIG. 8 is a diagram illustrating a modification of a comparison result generator, such as that of FIG. 7.

FIG. 8 is a diagram illustrating a modification of the comparison result generator of FIG. 7.

In describing the comparison result generator illustrated in FIG. 8, components common to those in FIG. 7 are not described again.

Referring to FIG. 8, a switching component SW included in the current detector 321 may include a third transistor Tr3 and a fifth transistor Tr5, gate electrodes of which are coupled in common to each other.

The third transistor Tr3 is identical to that illustrated in FIG. 7.

A first electrode of the fifth transistor Tr5 is coupled to a fifth node N5, to which a second electrode of the second transistor Tr2 is coupled. A second electrode of the fifth transistor Tr5 is coupled to the third node N3. A gate electrode of the fifth transistor Tr5 may be coupled to a sixth node N6. A first operation signal OPSIG1 is applied to the sixth node N6.

Similar to the description made with reference to FIG. 7, the circuit illustrated in FIG. 8 is only an example, and the invention is not limited to the circuit illustrated in FIG. 8.

Figure 9:
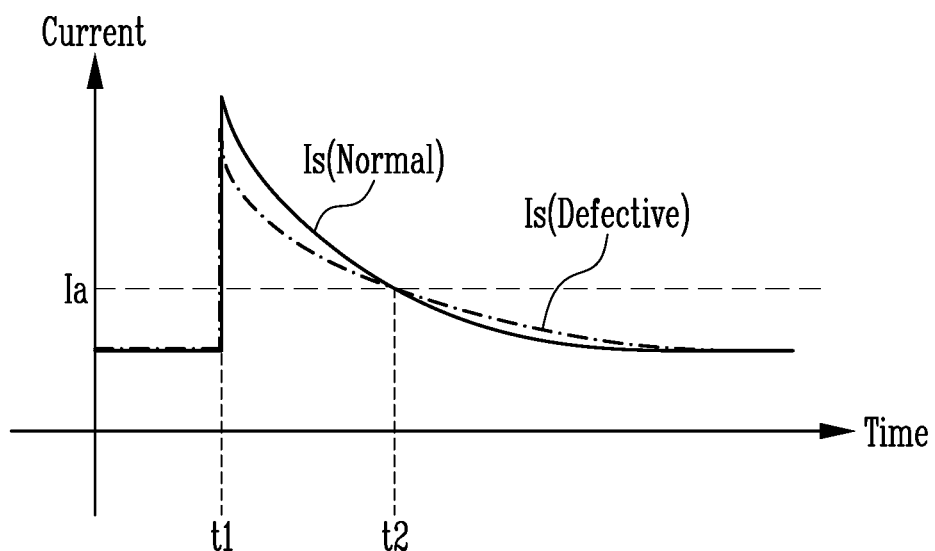
FIG. 9 is a diagram illustrating an example of how current of a target word line changes over time.

FIG. 9 is a diagram illustrating an example of the current of a target word line.

Referring to FIGS. 7 and 9, at a first time t1, a first operation signal OPSIG1 may be provided to the current detector 321. A test voltage Vtest may be applied to the target word line. The current Is of the target word line may be increased to a specific level at the first time t1.

At the first time t1, the level of the current Is(Defective) of a defective target word line may be lower than the level of the current Is(Normal) of a normal target word line.

After the first time t1, the current Is of the target word line may be nonlinearly decreased. Here, the degree to which the current Is of the target word line is nonlinearly decreased may differ according to the RC time constant.

After the first time t1, the RC time constant corresponding to the defective target word line may be greater than the RC time constant corresponding to the normal target word line. Therefore, based on the same period, the decrement of the current Is(Defective) of the defective target word line may be less than the decrement of the current Is(Normal) of the normal target word line.

A defect in the word line may also be detected by comparing the decrement of the current Is(Defective) of the defective target word line with the decrement of the current Is(Normal) of the normal target word line and determining the difference therebetween. However, the difference between the decrement corresponding to a defective state and the decrement corresponding to the normal state may not be large. Therefore, the word line test circuit 300 according to an embodiment of the present disclosure may detect a defect in the word line using the target voltage Vc corresponding to a voltage that is obtained by integrating the current Is of the target word line with respect to time, that is, the target voltage Vc charged in the capacitor Cint.

At a second time t2, the level of the current Is of the target word line may reach the level of the control current Ia. The reason for applying the control current Ia is to clearly detect the difference between the target voltage Vc charged by the current Is(Defective) of the defective target word line and the target voltage Vc charged by the current Is(Normal) of the normal target word line.

The control current Ia may be set through experiment, design, algorithm, etc., and indicated before the corresponding product is shipped. However, the control current may also be updated after the corresponding product has been shipped.

An interval from the first time t1 to the second time t2 may be determined according to the control current Ia.

Figure 10:
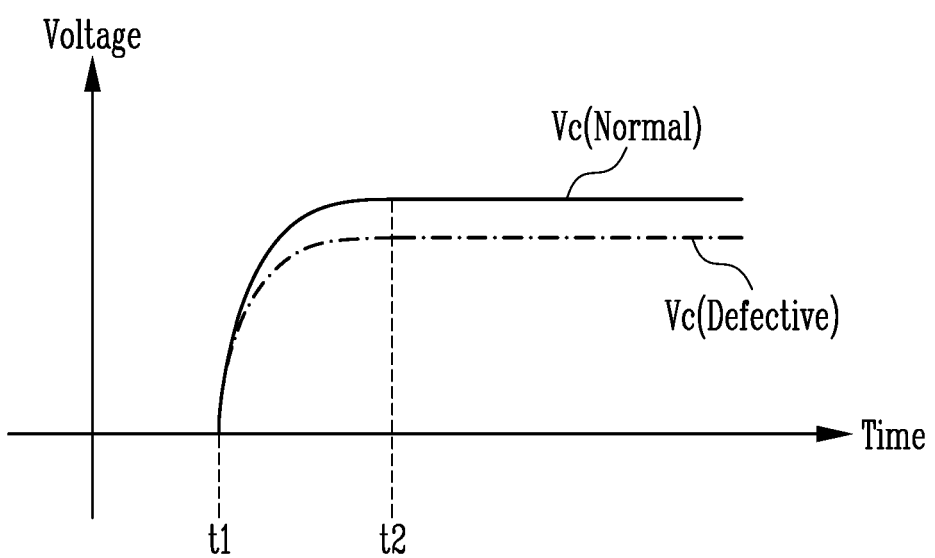
FIG. 10 is a diagram illustrating a target voltage with respect to time.

FIG. 10 is a diagram illustrating an exemplary target voltage.

Referring to FIGS. 7 and 10, as the current Is of a target word line is generated at a first time t1, and a test current Ic is provided to the capacitor Cint during an interval from the first time t1 to a second time t2, a target voltage Vc may be charged. The target voltage Vc may be nonlinearly increased.

At the second time t2, the target voltage Vc may be saturated to a specific level.

As illustrated in FIG. 9, since, during the interval from the first time t1 to the second time t2, an integrated (integral)

value of the current Is(Defective) of the defective target word line is less than an integrated value of the current Is(Normal) of the normal target word line, the target voltage Vc(Defective) corresponding to the defective target word line may be lower than the target voltage Vc(Normal) corresponding to the normal target word line.

Figure 11:
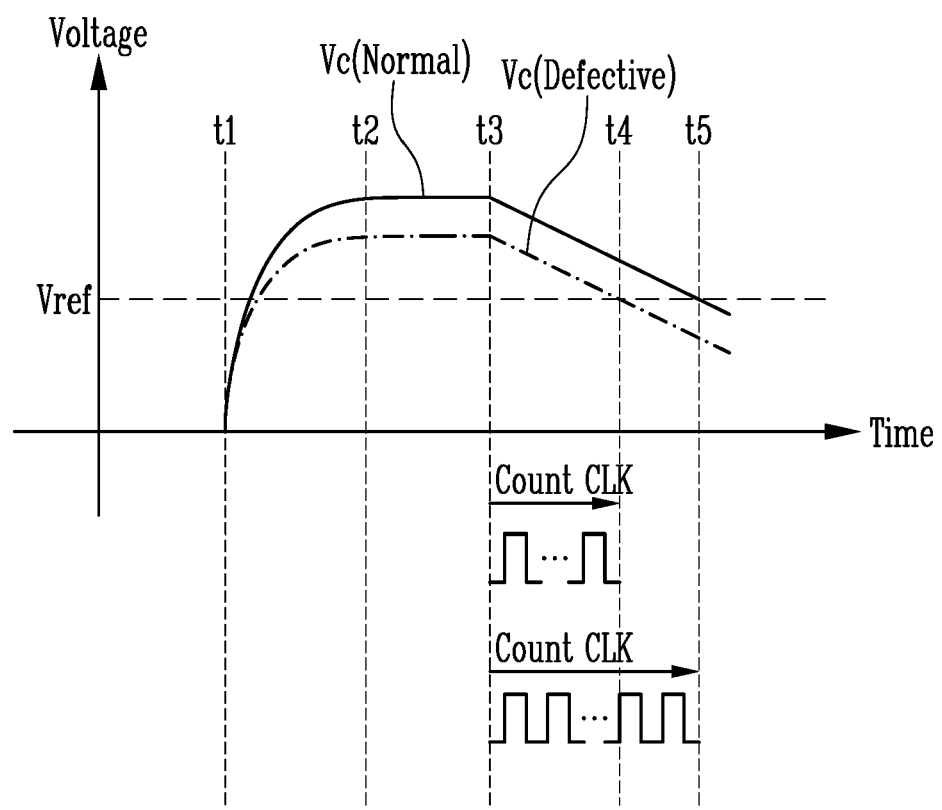
FIG. 11 is a diagram illustrating an embodiment in which a reference clock is counted.

FIG. 11 is a diagram illustrating an embodiment in which cycles of a reference clock is counted.

Referring to FIGS. 7 and 11, at a third time t3 after a second time t2, a second operation signal OPSIG2 and a third operation signal OPSIG3 may be provided to the voltage comparator 324. The voltage comparator 324 may discharge the charged target voltage Vc in response to the second operation signal OPSIG2. Also, the voltage comparator 324 may, in response to the third operation signal OPSIG3, compare the discharged target voltage Vc with the reference voltage Vref and may output a comparison signal COMPSIG based on the result of the comparison.

At the third time t3, the target voltage Vc may start to be discharged, and the level of the target voltage Vc may be higher than that of the reference voltage Vref. The voltage comparator 324 may output the comparison signal COMPSIG at a first level to the word line defect detector 330 at a time (e.g., the third time t3) at which the target voltage Vc starts to be discharged. The word line defect detector 330 may count cycles of the reference clock CLK in response to the comparison signal COMPSIG at the first level.

At the third time t3, the voltage comparator 324 may receive the third operation signal OPSIG3, wherein the level of the target voltage Vc may be higher than that of the reference voltage Vref. The voltage comparator 324 may output the comparison signal COMPSIG at a first level to the word line defect detector 330 at a time (e.g., the third time t3) at which the third operation signal OPSIG3 is received. The word line defect detector 330 may count the reference clock CLK in response to the comparison signal COMPSIG at the first level.

At a fourth time t4, the level of the target voltage Vc(Defective) corresponding to the defective target word line is lower than that of the reference voltage Vref, and thus the voltage comparator 324 may output the comparison signal COMPSIG at a second level to the word line defect detector 330. The word line defect detector 330 may stop counting cycles of the reference clock CLK in response to the comparison signal COMPSIG at the second level, and may store a count CLK_CNT corresponding to the defective target word line.

At the fourth time t4, the level of the target voltage Vc(Normal) corresponding to the normal target word line is higher than that of the reference voltage Vref, and thus the word line defect detector 330 may continue to count the reference clock CLK in response to the comparison signal COMPSIG at the first level.

At a fifth time t5, the level of the target voltage Vc(Normal) corresponding to the normal target word line is lower than that of the reference voltage Vref, and thus the word line defect detector 330 may stop counting cycles of the reference clock CLK in response to the comparison signal COMPSIG at the second level, and may store the count CLK_CNT corresponding to the normal target word line.

The word line defect detector 330 may store counts CLK_CNT respectively corresponding to a plurality of word lines (e.g., word lines WL1 to WL16 illustrated in FIG. 3).

In an embodiment, the defect detector 333 may store the counts CLK_CNT respectively corresponding to the plurality of word lines (e.g., word lines WL1 to WL16 illustrated in FIG. 3) in one memory block (e.g., MBi illustrated in FIG. 3).

In an embodiment, the defect detector 333 may store the counts CLK_CNT respectively corresponding to first word lines (e.g., WL1 illustrated in FIG. 3) in memory blocks (e.g., t memory blocks MB1 to MBk illustrated in FIG. 2). Here, the first word lines are WL1s, but that is merely an example, and the invention is not limited thereto.

In an embodiment, the defect detector 333 may store the counts CLK_CNT corresponding to a plurality of word lines (e.g., the plurality of word lines WL1 to WL16 illustrated in FIG. 3) in each of memory blocks (e.g., memory blocks MB1 to MBk illustrated in FIG. 2).

Figure 12:
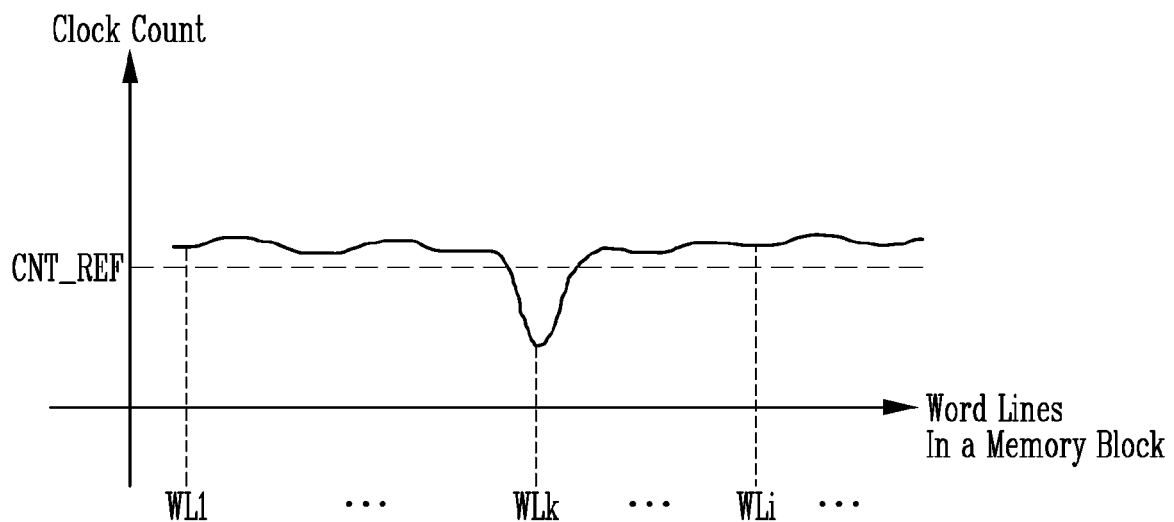
FIG. 12 is a diagram illustrating an embodiment of a method of detecting defects in a plurality of word lines in one memory block.

FIG. 12 is a diagram illustrating an embodiment of a method of detecting defects in a plurality of word lines included in one memory block.

Referring to FIG. 12, counts CLK_CNT respectively corresponding to a plurality of word lines WL1 to WLi (where i is a positive integer greater than k) in one memory block may be stored in a defect detector 333. The embodiment of FIG. 12 uses one reference count CNT_REF.

The defect detector 333 may determine whether any of the counts CLK_CNT is less than the reference count.

For example, as shown in FIG. 12, a count CLK_CNT corresponding to a k-th word line WLk, among the plurality of word lines WL1 to WLi, is less than the reference count CNT_REF.

The defect detector 333 detects that each word line corresponding to a count CLK_CNT that is less than the reference count CNT_REF is a defective word line.

In the embodiment of FIG. 12, the k-th word line WLk is detected to be defective.

Figure 13:
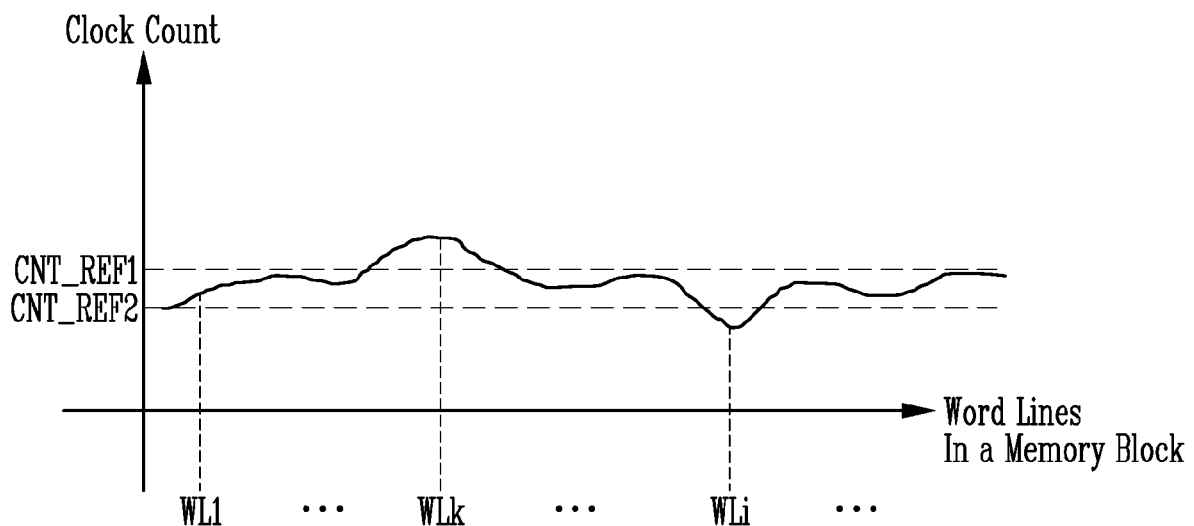
FIG. 13 is a diagram illustrating an embodiment of a method of detecting defects in a plurality of word lines in one memory block.

FIG. 13 is a diagram illustrating an embodiment of a method of detecting defects in a plurality of word lines in one memory block.

Referring to FIG. 13, counts CLK_CNT respectively corresponding to a plurality of word lines WL1 to WLi in one memory block may be stored in a defect detector 333.

Any of the plurality of word lines may be manufactured with a size greater or less than the target size. Each word line having a size different from the required size may be determined to be a defective word line. Therefore, in order to detect a word line having a size different than the target size, two reference values are used to define a target size range.

Therefore, the defect detector 333 may determine whether there is any count CLK_CNT falling within a range from a first reference count CNT_REF1 to a second reference count CNT_REF2. Here, the range from the first reference count CNT_REF1 to the second reference count CNT_REF2 may be defined as a reference range.

In the embodiment of FIG. 13, CLK_CNT corresponding to the k-th word line WLk and CLK_CNT corresponding to an i-th word line WLi do not fall within the reference range. Other than those two counts, the count of each of the other word lines falls within the reference range.

The defect detector 333 determines a word line corresponding to a count CLK_CNT falling within the reference range to be normal. The defect detector 333 determines a word line corresponding to a count CLK_CNT falling out of the reference range to be defective.

In the embodiment of FIG. 13, the k-th word line WLk and the i-th word line WLi are detected to be defective.

Figure 14:
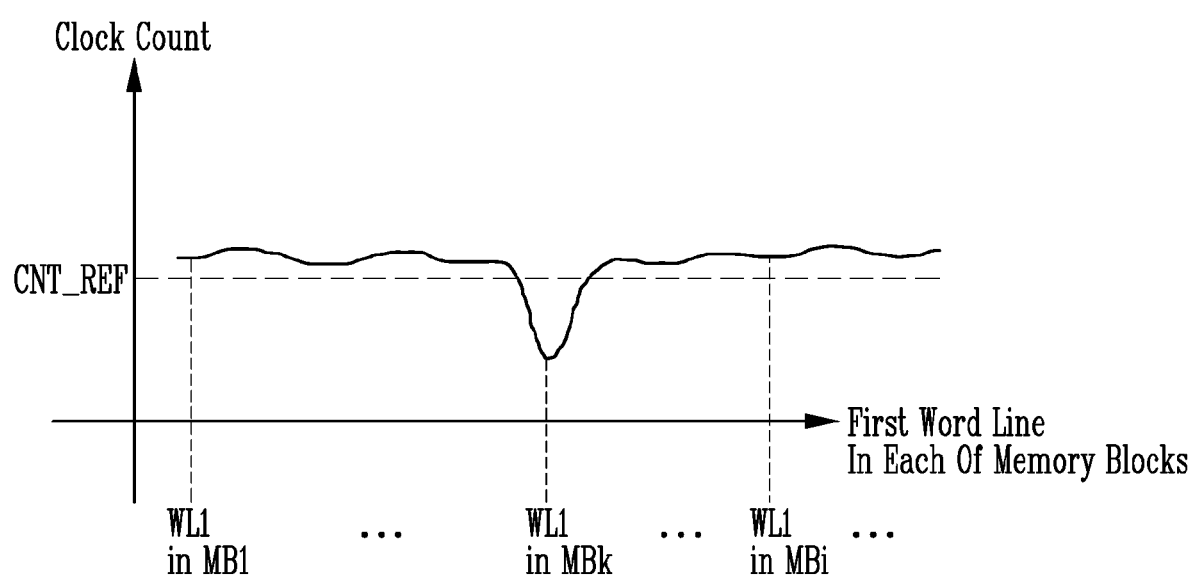
FIG. 14 is a diagram illustrating an embodiment of a method of detecting a defect in a specific word line in each of a plurality of memory blocks.

FIG. 14 is a diagram illustrating an embodiment of a method of detecting a defect in a specific word line in each of a plurality of memory blocks.

Referring to FIG. 14, counts CLK_CNT corresponding to first word lines WL1 respectively included in a plurality of memory blocks MB1 to MBi may be stored in the defect detector 333.

As described above with reference to FIG. 12, the defect detector 333 may determine whether there any first word line counts is less than a reference count CNT_REF. Further, the defect detector 333 detects that each word line corresponding to a count CLK_CNT that is less than the reference count CNT_REF is a defective word line.

For example, in FIG. 14, the count CLK_CNT corresponding to the first word line WL1 in the k-th memory block MBk is less than the reference count CNT_REF. In this case, the defect detector 333 detects that the first word line WL1 in the k-th memory block MBk is a defective word line.

Although the first word line WL1 is used as an example in FIG. 14, the method may be applied to any group of like-positioned word lines in the memory blocks, e.g., the sixth word line WL6.

Although not illustrated in the drawing, as illustrated in FIG. 13, the defect detector 333 may detect a defect in a target word line based on the reference range with the counts CLK_CNT.

Figure 15:
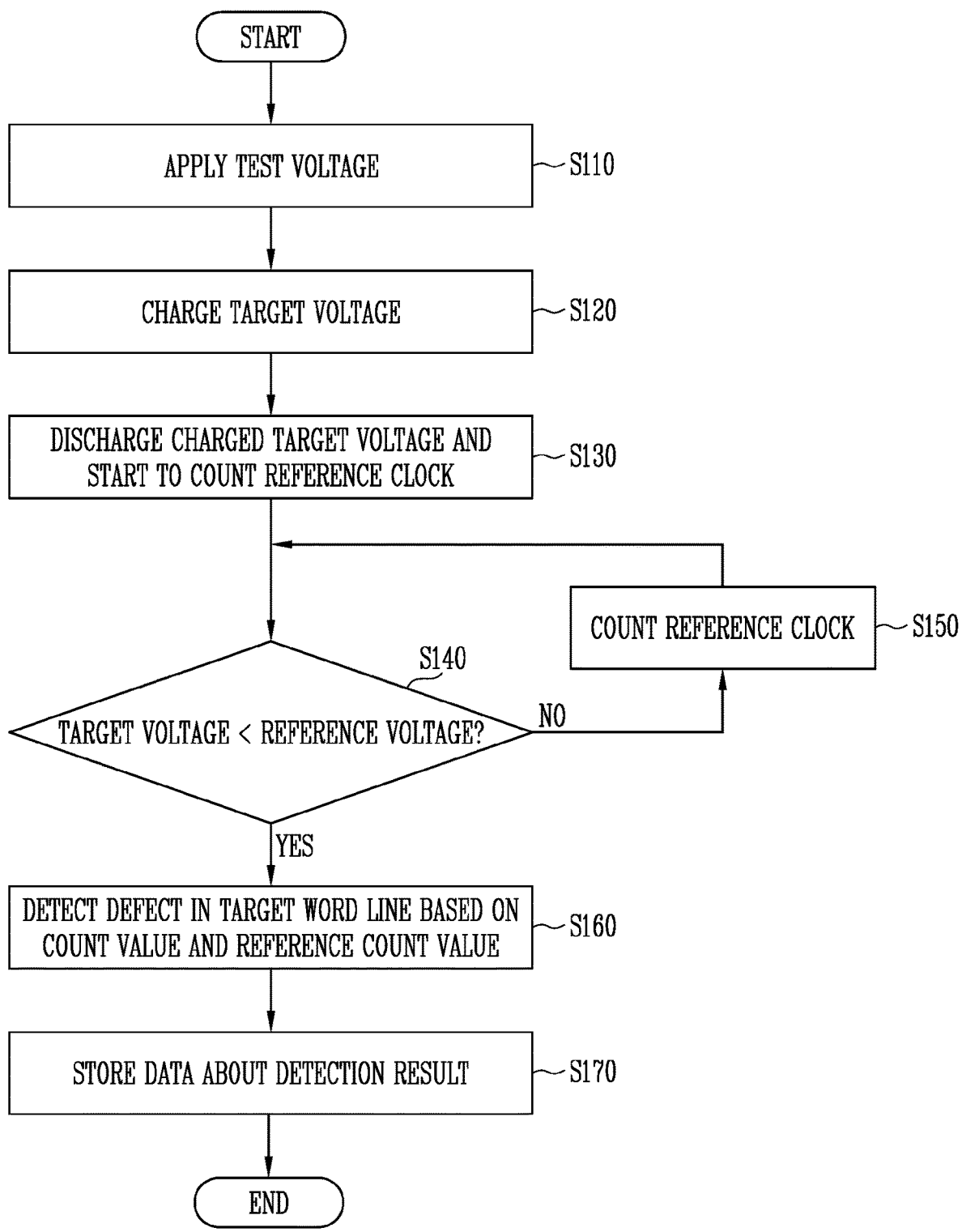
FIG. 15 is a flowchart illustrating a method of detecting defects in word lines according to an embodiment of the present disclosure.

FIG. 15 is a flowchart illustrating a method of detecting defects in word lines according to an embodiment of the present disclosure.

Referring to FIG. 15, a memory device 100 may apply a test voltage Vtest to a selected target word line at operation S110. In detail, the memory device 100 generates the test voltage Vtest in response to a test command TCMD output from a memory controller 200, and applies the test voltage Vtest to a target word line.

The memory device 100 charges a target voltage Vc using the test voltage Vtest at operation S120. In detail, the memory device 100 may generate the current Is of the target word line, which varies with the test voltage Vtest, and may charge a capacitor Cint to the target voltage Vc based on the test current Ic in which the current Is of the target word line is reflected.

The memory device 100 may discharge the charged target voltage Vc, and may start to count cycles of the reference clock CLK at operation S130. In detail, the memory device 100 discharges the charged target voltage Vc using a flush current Id, and counts cycles of the reference clock CLK starting from a time at which the target voltage Vc is discharged.

The memory device 100 determines whether the discharged target voltage Vc is less than the reference voltage Vref at operation S140.

When the discharged target voltage Vc is equal to or greater than the reference voltage Vref (No at operation S140), the memory device 100 continues to count cycles of the reference clock CLK at operation S150.

When the discharged target voltage Vc is less than the reference voltage Vref (Yes at operation S140), the memory device 100 detects a defect in the target word line based on the count CLK_CNT and the reference count CNT_REF at operation S160, and stores data DATA about the result of detection at operation S170.

Figure 16:
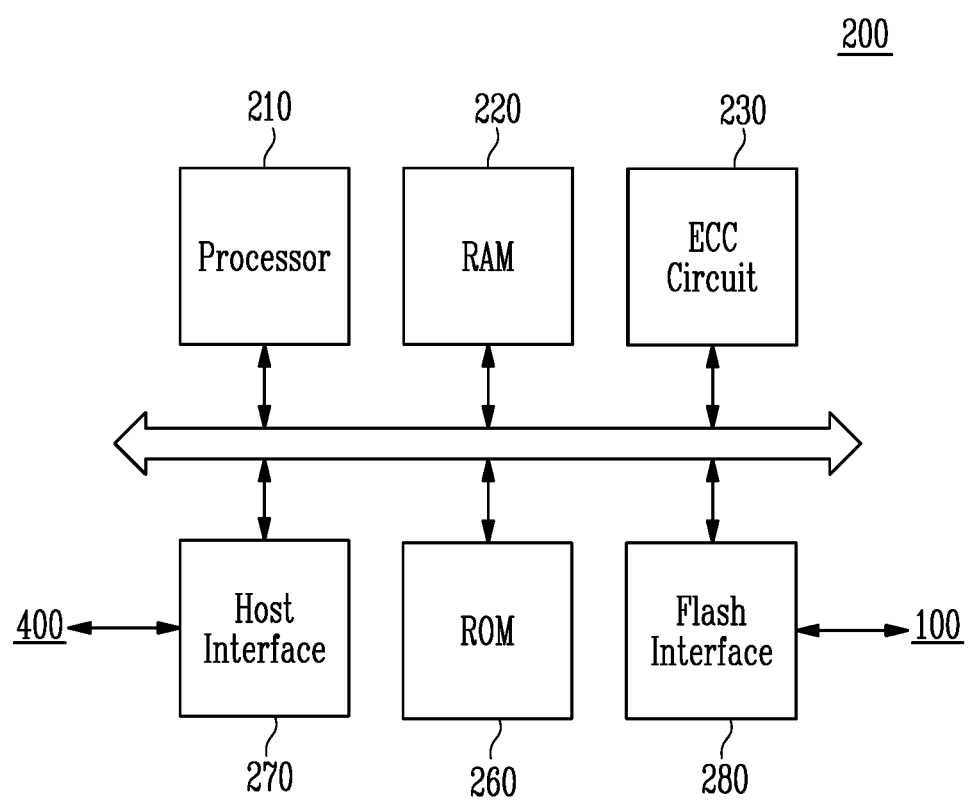
FIG. 16 is a diagram illustrating a memory controller according to an embodiment of the present disclosure.

FIG. 16 is a diagram illustrating a memory controller according to an embodiment of the present disclosure.

Referring to FIGS. 1 and 16, the memory controller 200 may include a processor 210, a RAM 220, an error correction circuit 230, a ROM 260, a host interface 270, and a flash interface 280.

The processor 210 may control overall operation of the memory controller 200.

The RAM 220 may be used as a buffer memory, a cache memory, or a working memory for the memory controller 200. In an example, the buffer memory may be the RAM 220, and may be, for example, an SRAM.

The ROM 260 may store various types of information for the operation of the memory controller 200 in the form of firmware.

The memory controller 200 may communicate with an external device (e.g., the host 400, an application processor or the like) through the host interface 270.

The memory controller 200 may communicate with the memory device 100 through the flash interface 280. The memory controller 200 may transmit a command CMD, an address ADDR, a control signal CTRL, etc. to the memory device 100 and receive data DATA from the memory device 100, through the flash interface 280.

The flash interface 280 may include, for example, a NAND interface.

Figure 17:
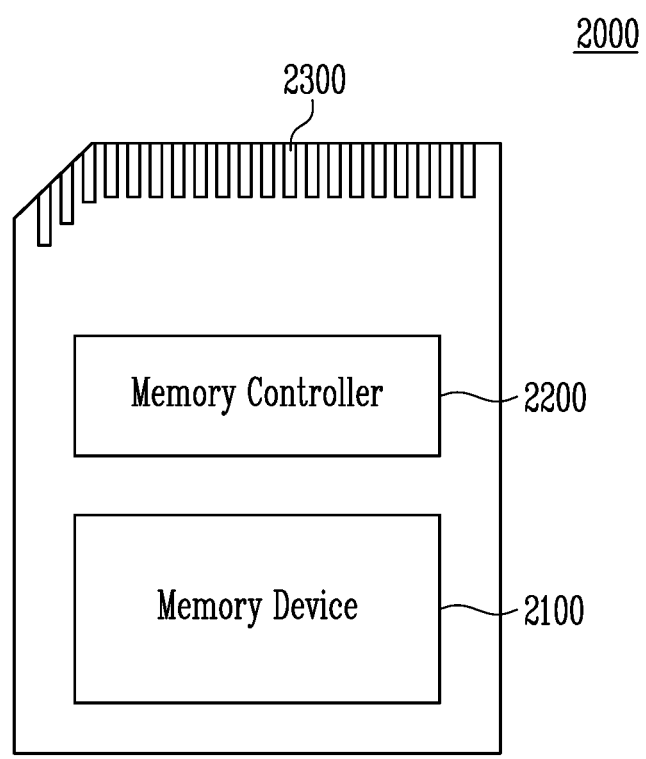
FIG. 17 is a block diagram illustrating a memory card system to which a storage device is applied according to an embodiment of the present disclosure.

FIG. 17 is a block diagram illustrating a memory card system to which a storage device is applied according to an embodiment of the present disclosure.

Referring to FIGS. 1 and 17, a memory card system 2000 may include a memory device 2100, a memory controller 2200, and a connector 2300.

In an embodiment, the memory device 2100 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-transfer torque magnetic RAM (STT-MRAM).

The memory controller 2200 is coupled to the memory device 2100. The memory controller 2200 may access the memory device 2100. For example, the memory controller 2200 may control read, write, erase, and background operations of the memory device 2100. The memory controller 2200 may provide an interface between the memory device 2100 and a host 400. The memory controller 2200 may run firmware for controlling the memory device 2100. The memory controller 2200 may be implemented in the same manner as the memory controller 200 of FIG. 1.

In an embodiment, the memory controller 2200 may include components, such as a RAM, a processor, a host interface, a memory interface, and an error correction circuit.

The memory controller 2200 may communicate with an external device through the connector 2300. The memory controller 2200 may communicate with an external device (e.g., the host 400) based on a specific communication protocol. In an embodiment, the memory controller 2200 may communicate with the external device through at least one of various interface protocols such as universal serial bus (USB), multimedia card (MMC), embedded MMC (eMMC), peripheral component interconnect (PCI), PCI-express (PCI-E), an advanced technology attachment (ATA) protocol, a serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and/or nonvolatile memory express (NVMe) protocols. In an embodiment, the connector 2300 may be defined by at least one of the above-described various communication protocols.

The memory device 2100 and the memory controller 2200 may be integrated into a single semiconductor device to form a memory card, such as a personal computer memory card international association (PCMCIA), a compact flash card (CF), a smart media card (SM or SMC), a memory stick, a multimedia card (MMC, RS-MMC, MMCmicro or eMMC), a SD card (SD, miniSD, microSD, or SDHC), a universal flash storage (UFS), or the like.

Figure 18:
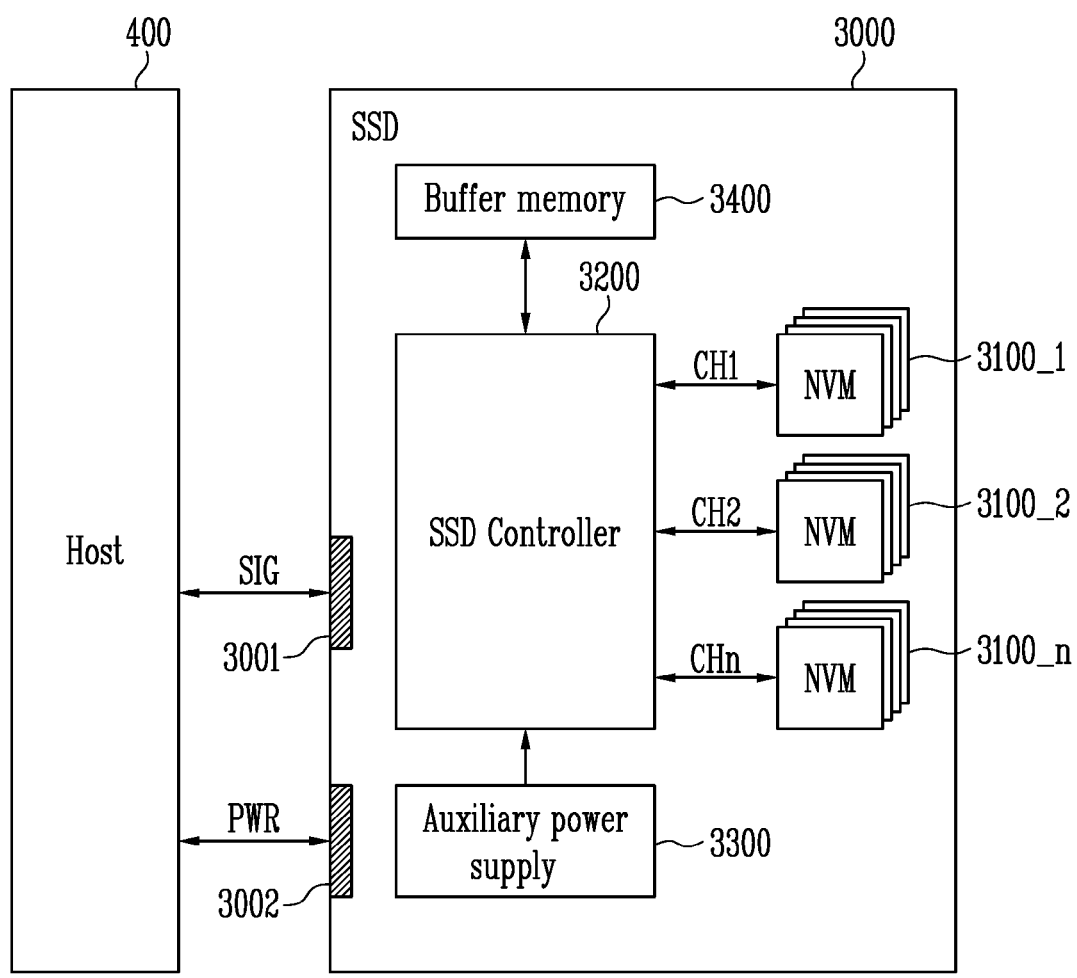
FIG. 18 is a block diagram illustrating a solid state drive (SSD) system to which a storage device is applied according to an embodiment of the present disclosure.

FIG. 18 is a block diagram illustrating a solid state drive (SSD) system to which a storage device is applied according to an embodiment of the present disclosure.

Referring to FIGS. 1 and 18, the SSD system may include a host 400 and an SSD 3000.

The SSD 3000 may exchange a signal SIG with the host 400 through a signal connector 3001, and may receive power PWR through a power connector 3002. The SSD 3000 may include an SSD controller 3200, a plurality of flash memories 3100_1, 3100_2, and 3100_n, an auxiliary power supply 3300, and a buffer memory 3400.

In accordance with an embodiment of the present disclosure, the SSD controller 3200 may perform the function of the memory controller 200 of FIG. 1.

The SSD controller 3200 may control the plurality of flash memories 3100_1, 3100_2, and 3100_n in response to the signal(s) SIG received from the host 400. In an embodiment, the signal(s) SIG may be based on the interfaces of the host 400 and the SSD 3000. For example, the signal(s) SIG may be defined by at least one of various interfaces such as universal serial bus (USB), multimedia card (MMC), embedded MMC (eMMC), peripheral component interconnect (PCI), PCI-express (PCI-E), an advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and/or nonvolatile memory express (NVMe) interfaces.

The auxiliary power supply 3300 may be coupled to the host 400 through the power connector 3002. The auxiliary power supply 3300 may be supplied with, and charged by, power PWR from the host 400. The auxiliary power supply 3300 may supply the power of the SSD 3000 when the supply of power from the host 400 is not smoothly delivered. In an embodiment, the auxiliary power supply 3300 may be located inside the SSD 3000 or located outside the SSD 3000. For example, the auxiliary power supply 3300 may be located in a main board, and may also provide auxiliary power to the SSD 3000.

The buffer memory 3400 may temporarily store data. For example, the buffer memory 3400 may temporarily store data received from the host 400 or data received from the plurality of flash memories 3100_1, 3100_2, and 3100_n, or may temporarily store metadata (e.g., mapping tables) of the flash memories 3100_1, 3100_2, and 3100_n. The buffer memory 3400 may include any of various volatile memories, such as DRAM, SDRAM, DDR SDRAM, LPDDR SDRAM, and GRAM, or any of various nonvolatile memories, such as FRAM, ReRAM, STT-MRAM, and PRAM.

Figure 19:
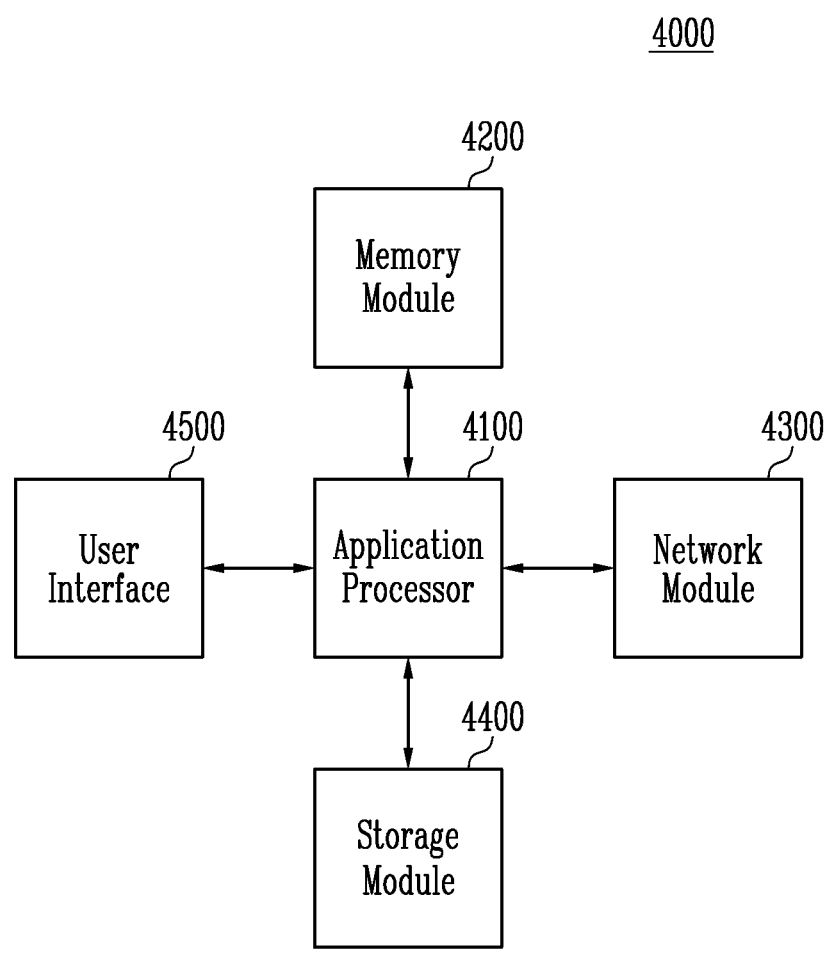
FIG. 19 is a block diagram illustrating a user system to which a storage device is applied according to an embodiment of the present disclosure.

FIG. 19 is a block diagram illustrating a user system to which a storage device is applied according to an embodiment of the present disclosure.

Referring to FIG. 19, a user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided in the form of a system-on-chip (SoC).

The memory module 4200 may function as a main memory, a working memory, a buffer memory or a cache memory of the user system 4000. The memory module 4200 may include any of various volatile RAMs such as DRAM, SDRAM, DDR SDRAM, DDR2 SDRAM, DDR3 SDRAM, LPDDR SDARM, LPDDR2 SDRAM, and LPDDR3 SDRAM or any of various nonvolatile RAMs such as PRAM, ReRAM, MRAM, and FRAM. In an embodiment, the application processor 4100 and the memory module 4200 may be packaged based on a package-on-package (POP), and may then be provided as a single semiconductor package.

The network module 4300 may communicate with external devices. In an embodiment, the network module 4300 may support wireless communication, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, or WiFi. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a 3D structure. In an embodiment, the storage module 4400 may be provided as a removable storage medium (removable drive), such as a memory card or an external drive of the user system 4000.

In an example, the storage module 4400 may be operated in the same manner as the storage device 1000 of FIG. 1. The storage module 4400 may include a plurality of nonvolatile memory devices, each of which may be operated in the same manner as the memory device 100 of FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may further include user output interfaces such as a liquid crystal display (LCD), an organic light-emitting diode (OLED) display device, an active matrix OLED (AMOLED) display device, an LED, a speaker, and/or a monitor.

As described above, in accordance with embodiments of the present disclosure, there is an advantage in that defects in word lines may be detected, and thus the performance of a storage device may be prevented from being deteriorated.

In accordance with embodiments of the present disclosure, there is provided a storage device that detects defects in word lines, thus preventing the performance of the storage device from being deteriorated.

While the present invention has been illustrated and described in the context of specific embodiments, those skilled in the art will understand in view of the present disclosure that various modifications may be made consistent with the teachings herein. The present invention encompasses all such modifications that fall within the scope of the claims.

What is claimed is:

1. A word line test circuit, comprising:
an operation signal generator configured to generate a plurality of operation signals in response to a test command;
a comparison result generator configured to, in response to the plurality of operation signals, generate a target voltage based on a test current, in which a current of a target word line varying with a test voltage is reflected, and to generate a comparison signal based on a result of a comparison between the target voltage and a reference voltage; and
a word line defect detector configured to detect a defect in the target word line based on at least one reference count and a count of a reference clock, cycles of which are counted until a level of the comparison signal changes from a first level to a second level.

2. The word line test circuit according to claim 1, wherein the comparison result generator comprises:
a current detector configured to detect the test current in response to a first operation signal among the plurality of operation signals;
a voltage charger configured to charge the target voltage;
a reference voltage generator configured to generate the reference voltage based on the test voltage; and
a voltage comparator configured to discharge the target voltage in response to a second operation signal, among the plurality of operation signals, and output the comparison signal based on the result of the comparison between the target voltage and the reference voltage in response to a third operation signal, among the plurality of operation signals,
wherein the test current is a current less than a current of the target word line, and
wherein the target voltage is a result of integrating the test current with respect to time.

3. The word line test circuit according to claim 2, wherein the current detector comprises:
a control current source configured to provide a control current;
a current mirror configured to output the test current, which is less than the current of the target word line by a magnitude of the control current; and
a switching component configured to electrically couple the target word line to the current mirror in response to the first operation signal.

4. The word line test circuit according to claim 2, wherein the voltage charger comprises:
a capacitor configured to charge the target voltage using the test current.

5. The word line test circuit according to claim 2, wherein the reference voltage generator comprises:
a reference current source configured to provide a reference current; and
a reference resistor coupled in series to the reference current source.

6. The word line test circuit according to claim 2, wherein the voltage comparator is configured to:
generate the comparison signal at the first level at a time at which the target voltage starts to be discharged, and
output the comparison signal at the second level at a time at which the target voltage becomes less than the reference voltage.

7. The word line test circuit according to claim 2, wherein the voltage comparator is configured to:
receive the target voltage through a first input terminal,
receive the reference voltage through a second input terminal,
output the comparison signal at the first level when the target voltage is equal to or greater than the reference voltage, and
output the comparison signal at the second level when the target voltage is less than the reference voltage.

8. The word line test circuit according to claim 2, wherein the operation signal generator is configured to, after the first operation signal has been output, output the second operation signal and the third operation signal,
wherein the voltage comparator is configured to output the comparison signal at the first level at a time at which the third operation signal is received.

9. The word line test circuit according to claim 1, wherein the word line defect detector comprises:
a clock generator configured to generate the reference clock;
a counter configured to start to count the reference clock in response to the comparison signal at the first level, and stop the count in response to the comparison signal at the second level; and
a defect detector configured to output a detection signal indicating a defect in the target word line depending on whether the count of the reference clock is less than the at least one reference count.

10. The word line test circuit according to claim 1, wherein:
the at least one reference count includes a first reference count and a second reference count less than the first reference count, and
the word line defect detector comprises:
a clock generator configured to generate the reference clock;
a counter configured to start to count the reference clock in response to the comparison signal at the first level, and stop the count in response to the comparison signal at the second level; and
a defect detector configured to output a detection signal indicating that the target word line is normal depending on whether the count of the reference clock falls within a range from the first reference count to the second reference count.

11. A memory device, comprising:
a memory cell array including a plurality of memory cells; and
a word line test circuit configured to:
generate a test voltage in response to a test command,
charge a target voltage based on a test current, in which a current of a target word line varying with the test voltage is reflected,
generate a comparison signal based on a result of a comparison between the target voltage and a reference voltage, and
detect a defect in the target word line based on at least one reference count and a count of a reference clock, cycles of which are counted until a level of the comparison signal changes from a first level to a second level.

12. The memory device according to claim 11, wherein the word line test circuit comprises:
an operation signal generator configured to generate a plurality of operation signals in response to the test command;

a comparison result generator configured to charge the target voltage in response to a first operation signal, among the plurality of operation signals, discharge the target voltage in response to a second operation signal, among the plurality of operation signals, and generate the comparison signal based on the result of the comparison between the target voltage and the reference voltage in response to a third operation signal, among the plurality of operation signals; and a word line defect detector configured to start to count the reference clock in response to the comparison signal at the first level, stop the count in response to the comparison signal at the second level, and detect a defect in the target word line based on the count of the reference clock and the at least one reference count, wherein the word line defect detector stores data corresponding to a detection result indicating whether a defect in the target word line has been detected.

13. The memory device according to claim 12, wherein the operation signal generator is configured to, after the first operation signal has been output, output the second operation signal and the third operation signal, wherein the comparison result generator is configured to output the comparison signal at the first level at a time at which the third operation signal is received.

14. The memory device according to claim 12, wherein the comparison result generator is configured to:

output the comparison signal at the first level when the target voltage is equal to or greater than the reference voltage, and output the comparison signal at the second level when the target voltage is less than the reference voltage.

15. The memory device according to claim 12, wherein the comparison result generator is configured to:

generate the comparison signal at the first level at a time at which the target voltage starts to be discharged, and output the comparison signal at the second level at a time at which the target voltage becomes less than the reference voltage.

16. The memory device according to claim 11, wherein the test current is less than the current of the target word line, wherein the charged target voltage is a result of integrating the test current with respect to time.

17. A storage device, comprising:

a memory controller configured to output a test command instructing a check whether a defect is present in a target word line; and a memory device configured to:

generate a test voltage in response to the test command, charge a target voltage based on a test current, in which a current of the target word line varying with the test voltage is reflected, generate a comparison signal based on a result of a comparison between the target voltage and a reference voltage, detect a defect in the target word line based on at least one reference count and a count of a reference clock, cycles of which are counted until a level of the comparison signal changes from a first level to a second level, and provide a test response that is a response to the test command to the memory controller.

18. The storage device according to claim 17, wherein the memory device is configured to:

when a defect in the target word line is detected, store data about the target word line, and provide the data to the memory controller under control of the memory controller.

19. The storage device according to claim 18, wherein the memory controller provides the memory device with a command that instructs a memory block corresponding to the target word line, among a plurality of memory blocks included in the memory device, to be processed as a bad block based on the data.

20. The storage device according to claim 17, wherein the test current is a current less than the current of the target word line, wherein the charged target voltage is a result of integrating the test current with respect to time.

* * * * *